United States Patent
Majumdar et al.

(10) Patent No.: US 11,996,336 B2
(45) Date of Patent: May 28, 2024

(54) ELECTRON BEAM PROBING TECHNIQUES AND RELATED STRUCTURES

(71) Applicant: Micron Technology, Inc., Boise, ID (US)

(72) Inventors: Amitava Majumdar, Boise, ID (US); Radhakrishna Kotti, Boise, ID (US); Mallesh Rajashekharaiah, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/714,770

(22) Filed: Apr. 6, 2022

(65) Prior Publication Data

US 2022/0301946 A1    Sep. 22, 2022

Related U.S. Application Data

(62) Division of application No. 16/700,976, filed on Dec. 2, 2019, now Pat. No. 11,302,589.

(51) Int. Cl.
*H01L 21/00* (2006.01)
*H01J 37/28* (2006.01)
(Continued)

(52) U.S. Cl.
CPC .............. *H01L 22/12* (2013.01); *H01J 37/28* (2013.01); *H01L 21/76802* (2013.01);
(Continued)

(58) Field of Classification Search
CPC ..... H01L 22/12; H01L 21/76802; H01J 37/28
See application file for complete search history.

(56) References Cited

U.S. PATENT DOCUMENTS

| | | | | |
|---|---|---|---|---|
| 6,000,050 A | * | 12/1999 | Komoda | G01R 31/318577 714/724 |
| 7,827,595 B2 | * | 11/2010 | Gociman | G06F 21/6218 726/8 |
| 8,125,829 B2 | * | 2/2012 | Tanzawa | G11C 16/0483 365/185.11 |
| 9,019,766 B2 | * | 4/2015 | Tanzawa | G11C 16/10 365/185.11 |

(Continued)

FOREIGN PATENT DOCUMENTS

| | | | | |
|---|---|---|---|---|
| CN | 112992197 A | * | 6/2021 | ............. G11C 29/04 |
| CN | 112992197 A | | 6/2021 | |

(Continued)

*Primary Examiner* — Laura M Menz
(74) *Attorney, Agent, or Firm* — Holland & Hart LLP

(57) ABSTRACT

Methods, systems, and devices for electron beam probing techniques and related structures are described to enable inline testing of memory device structures. Conductive loops may be formed, some of which may be grounded and others of which may be electrically floating in accordance with a predetermined pattern. The loops may be scanned with an electron beam and image analysis techniques may be used to generate an optical pattern. The generated optical pattern may be compared to an expected optical pattern, which may be based on the predetermined pattern of grounded and floating loops. An electrical defect may be determined based on any difference between the generated optical pattern and the expected optical pattern. For example, if a second loop appears as having a brightness corresponding to a grounded loop, this may indicate that an unintended short exists. Fabrication techniques may be adjusted for subsequent devices to correct identified defects.

18 Claims, 13 Drawing Sheets

(51) Int. Cl.
*H01L 21/66* (2006.01)
*H01L 21/768* (2006.01)
*H01L 23/528* (2006.01)
*H10B 63/00* (2023.01)
*G11C 13/00* (2006.01)
*H01J 37/04* (2006.01)
*H10N 70/00* (2023.01)
*H10N 70/20* (2023.01)

(52) U.S. Cl.
CPC .. *H01L 21/76834* (2013.01); *H01L 21/76877* (2013.01); *H01L 23/5283* (2013.01); *H10B 63/84* (2023.02); *G11C 13/0004* (2013.01); *G11C 13/0026* (2013.01); *G11C 13/0028* (2013.01); *G11C 13/004* (2013.01); *G11C 13/0069* (2013.01); *G11C 2213/71* (2013.01); *H01J 37/04* (2013.01); *H01J 2237/2804* (2013.01); *H01J 2237/2814* (2013.01); *H10N 70/231* (2023.02); *H10N 70/826* (2023.02); *H10N 70/8825* (2023.02)

(56) References Cited

U.S. PATENT DOCUMENTS

| | | | |
|---|---|---|---|
| 9,679,659 B2 * | 6/2017 | Shim | G11C 11/5635 |
| 10,403,359 B2 * | 9/2019 | Majumdar | G11C 13/003 |
| 10,650,891 B2 * | 5/2020 | Majumdar | G11C 13/004 |
| 10,672,500 B2 * | 6/2020 | Majumdar | H01L 22/14 |
| 10,892,022 B1 * | 1/2021 | Kavalipurapu | G11C 16/3427 |
| 11,302,589 B2 * | 4/2022 | Majumdar | H01L 23/5283 |
| 2019/0189209 A1 * | 6/2019 | Majumdar | G11C 29/56008 |
| 2019/0189237 A1 * | 6/2019 | Majumdar | H10N 70/231 |
| 2019/0341122 A1 * | 11/2019 | Majumdar | G11C 29/56016 |
| 2019/0355418 A1 * | 11/2019 | Majumdar | G11C 13/0004 |
| 2020/0388649 A1 * | 12/2020 | Takahashi | H10B 63/845 |
| 2021/0166979 A1 * | 6/2021 | Majumdar | H01J 37/28 |
| 2022/0301946 A1 * | 9/2022 | Majumdar | G11C 29/025 |

FOREIGN PATENT DOCUMENTS

WO 2020/251636 A1 12/2020
WO WO-2020251636 A1 * 12/2020 ............. H01L 27/24

* cited by examiner

▨ Resist Space 805
— Loop material 810
• Ground Connection 820

↙ 801

▨ Resist Space 805
— Line material 815
• Ground Connection 820

↙ 802

▨ Resist Space 805
— Loop material 810
• Ground Connection 820

↙ 803

▨ Resist Space 805
— Line material 815
• Ground Connection 820

↙ 804

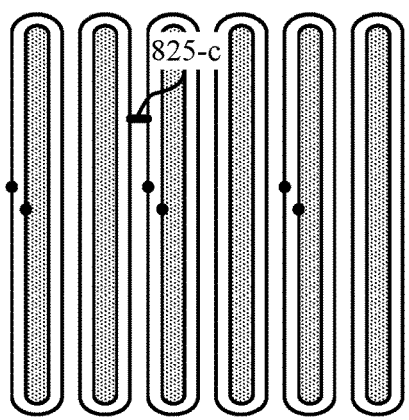
▨ Resist Space 805
— Loop material 810
• Ground Connection 820
FIG. 8E  ⤴ 805
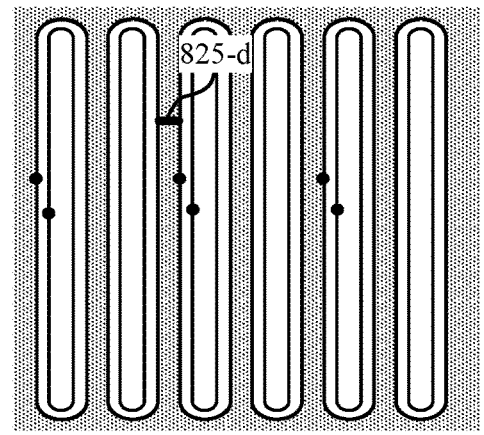
▨ Resist Space 805
— Loop material 810
• Ground Connection 820
FIG. 8F  ⤴ 806
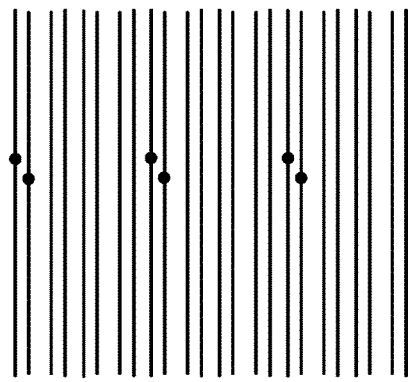
— Line material 815
• Ground Connection 820
FIG. 8G  ⤴ 807

ELECTRON BEAM PROBING TECHNIQUES AND RELATED STRUCTURES

CROSS REFERENCE

The present application for patent is a divisional of U.S. patent application Ser. No. 16/700,976 by Majumdar et al., entitled "ELECTRON BEAM PROBING TECHNIQUES AND RELATED STRUCTURES," filed Dec. 2, 2019, assigned to the assignee hereof, and is expressly incorporated by reference in its entirety herein.

BACKGROUND

The following relates generally to electronic devices (e.g., semiconductor devices, such as memory devices) and more specifically to electron beam probing techniques and related structures.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, a memory device may include one or more electrical defects, such as unintended conduction paths (e.g., shorts), which may inhibit memory device performance. Devices and techniques for determining electrical defects within a memory device may be desired.

BRIEF DESCRIPTION OF THE DRAWINGS

FIGS. 8A through 8G illustrate examples of circuits that support electron beam probing techniques and related structures in accordance with examples as disclosed herein.

DETAILED DESCRIPTION

Figure 1:
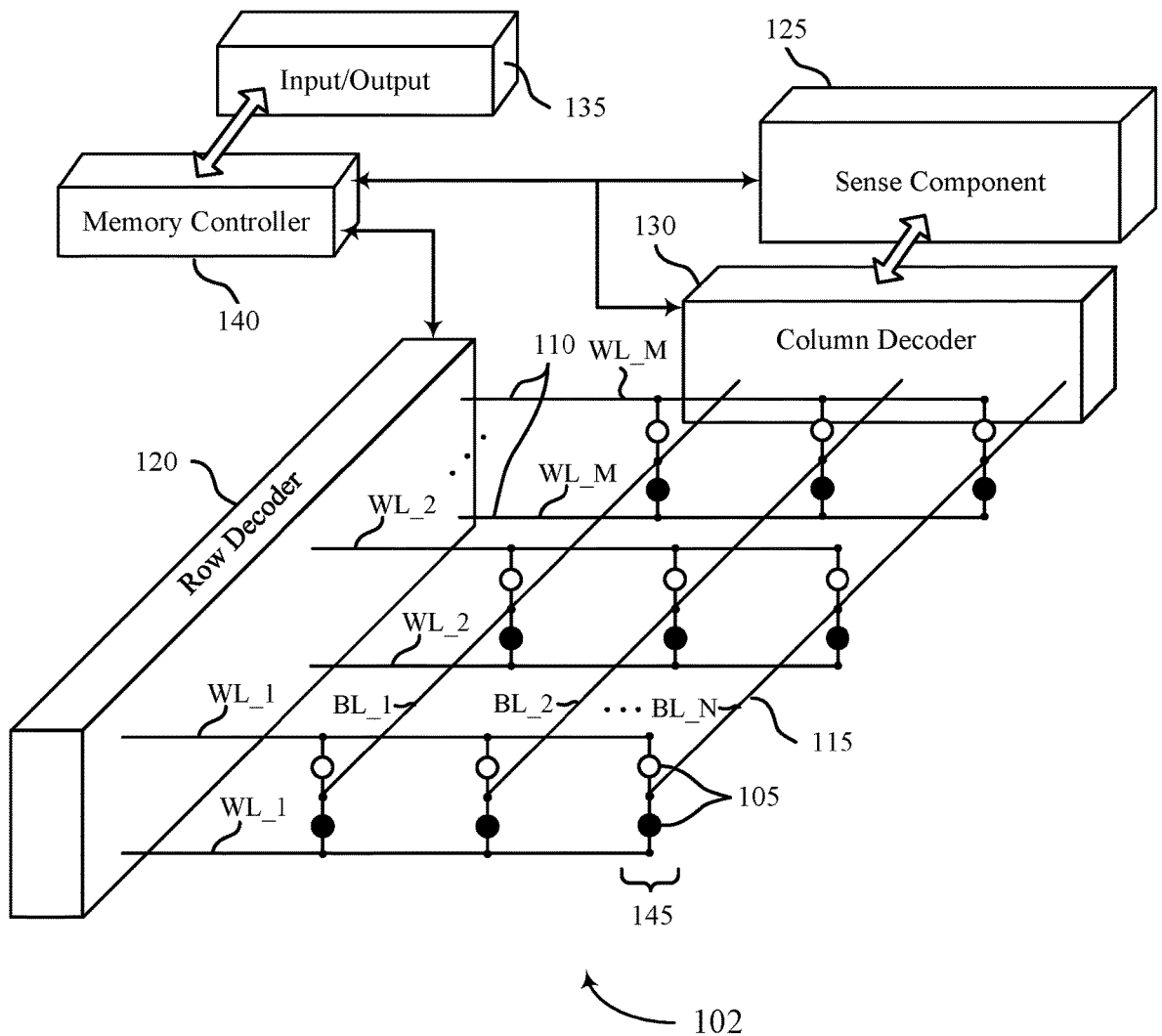
FIG. 1 illustrates an example of a memory array that supports electron beam probing techniques and related structures in accordance with examples as disclosed herein.

Designers and manufacturers of memory devices may test aspects of a memory device for electrical defects, such as unintended conduction paths (e.g., shorts or leakages) or disconnects (e.g., opens), for example, for quality control purposes or as part of the design process. For clarity, the word defect is used herein to described conduction paths or disconnects that are not included in the design of the memory device but which may be introduced during fabrication (e.g., due to variations or other unforeseen aspects in the fabrication process). An open may be a defect that includes an unintended electrical disconnect (e.g., break or void) between two elements or within an element (e.g., memory cells or access lines) of a memory device. A short or a leakage path may be a defect that includes an unintended electrical connection between two elements (e.g., memory cells or access lines) of a memory device.

Testing for electrical defects may be used to verify or refine device designs or device fabrication processes. Some techniques for testing for electrical defects may require that fabrication of a memory device be complete prior to testing, which may delay the acquisition of useful information and thus may increase design and manufacturing timelines and costs. Additionally or alternatively, some techniques for testing for electrical defects may require physically probing of a memory device with electrodes, which may be problematic for some device structures (e.g., structures with small physical dimensions or intervening materials that inhibit access to the structures for which testing is desired).

The devices and techniques described herein may support testing for electrical defects without contacting (e.g., physically contacting) a memory device with a physical probe, among other advantages. The devices and techniques described herein may also support testing for electrical defects at an intermediate fabrication step for a wafer or die (e.g., a fabrication step at which one or more access lines for the memory cells or related structures, such as structures that may later be used to form access lines, are exposed at an upper surface of the wafer), thereby reducing time to information for engineers and other personnel. The devices and techniques described herein may have benefits such as increasing reliability of memory devices, reducing design or manufacturing costs of memory devices, or reducing design or manufacturing time of memory devices, along with other benefits that may be appreciated by one of ordinary skill.

Techniques and structures are described herein that may support testing for unintended conduction paths, which may also be referred to as shorts or leakage paths. Some structures of a memory device (e.g., access lines or other materials) or of other electronic devices may be formed by making loops of a material (or of a stack of materials) and later removing loop ends, with the remaining portions of the loops comprising lines of the material. Such processes may be referred to as pitch multiplication, and may be employed in the fabrication of electronic (e.g., semiconductor) devices generally, with memory devices being an example.

In some cases, inline testing of loops and related structures and processes may be desirable before loop ends are removed, for example, due to process, equipment, or other fabrication constraints. Accordingly, sets of loops may be fabricated such that some of the loops in a set are grounded while other loops in a set are electrically floating. The grounded and floating loops may be arranged in accordance with a predetermined pattern (e.g., a pattern that is known prior to testing for electrical defects). For example, grounded loops may alternate with floating loops. At a time during fabrication at which the loops are exposed on an upper surface of a waver, the loops may be scanned with an electron beam, and image analysis (e.g., voltage contrasting) techniques may be used to generate an optical pattern. The optical pattern may indicate which of the floating loops become coupled with the ground reference when scanned (e.g., appear as having a first brightness, such as being relatively bright in an EBI image), and which of the floating loops do not become coupled with the ground reference when scanned (e.g., appear as having a second brightness, such as being relatively dark in an EBI image). The generated optical pattern may be compared to an expected optical pattern, which may be based on the predetermined pattern according to which the loops are configured.

For example, if the loops in a set are configured according to a pattern of alternating floating loops and grounded loops, then the expected optical pattern may be alternating bright loops and dark loops. An electrical defect may be determined based on a difference between the generated optical pattern and the expected optical pattern. For example, if a loop expected to be floating appears as having a first brightness corresponding to a grounded loop (e.g., appears as relatively bright), it may be determined that an unintended short or leakage exists (e.g., between the loop excepted to be floating and an adjacent grounded loop). When a short or a leakage is identified, fabrication techniques may be adjusted for subsequent devices to correct the identified defect(s) (e.g., structure distances and/or widths may be adjusted). In some cases, different sets of loops may be fabricated on the same wafer or die using different fabrication technique to support testing for different types or sources of defects.

While many of the teachings herein may be explained with reference to memory devices by way of example, it is to be understood that the teachings herein are not so limited but instead may be applied to any fabrication method or process that may employ pitch multiplication techniques, for any type of device. For example, any electronic device that includes patterned lines (e.g., conductive lines) may employ the described techniques to fabricate and test the lines.

Features of the disclosure are initially described in the context of memory systems and dies as described with reference to FIGS. 1 and 2. Features of the disclosure are described in the context of methods, circuits, and structures as described with reference to FIGS. 3-9. These and other features of the disclosure are further illustrated by and described with reference to an apparatus diagram and flowcharts that relate to electron beam probing techniques and related structures as described with references to FIGS. 10-12.

FIG. 1 illustrates an example memory device 100 that supports electron beam probing in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and not necessarily actual physical positions within the memory device 100.

In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145. In some cases, the memory cell stack 145 may include multiple memory cells 105 laid on top of another while sharing an access line. The memory cells 105 may in some cases be configured to each store one bit of data.

A memory cell 105 may, in some examples, be a self-selecting memory cell, a phase change memory (PCM) cell, and/or another type of resistive or threshold-based memory cell. A self-selecting memory cell 105 may include one or more components of a material (e.g., a chalcogenide material) that each function both as a storage element and as a cell selector (selection) element, thereby eliminating the need for separate cell selector circuitry (a selector element that does not contribute to storage). Such an element may be referred to as a storage and selector component (or element), or as a self-selecting memory component (or element). In contrast, other types of memory cells, such as dynamic random access memory (DRAM) or PCM cells, may each include a separate (dedicated) cell selector element such as a two-terminal selector element (e.g., a chalcogenide element configured to remain in an amorphous state) or a three-terminal selector element (e.g., a transistor) to contribute to the selection or non-selection of the memory cell without contributing to the storage of any logic state.

Memory array 102 may include multiple word lines 110 (e.g., row lines) for each deck, labeled WL_1 through WL_M, and multiple bit lines 115 (e.g., column lines), labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may generically be referred to as access lines because they may permit access to memory cells 105. In some examples, bit lines 115 may also be known as digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively doped semiconductors, or other conductive materials, alloys, compounds, or the like—a material included in an access line may be referred to as an access line material.

Word lines 110 and bit lines 115 may be substantially perpendicular (i.e., orthogonal) to one another or otherwise intersect one another to create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

In some cases, word lines 110 and bit lines 115 may be fabricated at least in part by forming loops (bands, racetracks, rings, rectangles) of access line material, possibly by forming loops out of a stack of materials that includes the access line material. Loop ends (shorter ends of the loops) may be subsequently removed (e.g., chopped), leaving the longer ends of the loops (straightaways of the racetracks) as the access lines.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting or other memory components (e.g., a selection component and a storage component) separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

The electrodes within a memory cell stack 145 may each be of a same material (e.g., carbon) or may be of various (different) materials. In some cases, the electrodes may be a different material than the access lines. In some examples, the electrodes may shield a material (e.g., a chalcogenide material) included in a self-selecting or other memory component from the word line 110, from the bit line 115, and from each other to prevent chemical interaction between the material and the word line 110, the bit line 115, or another memory component.

Operations such as reading and writing may be performed on memory cells 105 by activating or selecting a corresponding word line 110 and bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Though illustrated to the side of the memory array 102 for clarity, the row decoder 120 and column decoder 130 may in some cases be below the memory array 102. Each decoder 120, 130 may include or be coupled with one or more drivers configured to drive the access lines 110, 115 to desired voltages (e.g., to access one or more associated memory cells 105). In some cases, the drivers may be distributed throughout an area under the memory array 102. Vias may extend through one or more layers or decks of the memory device 100 to couple the drivers with their corresponding access lines 110, 115. For example, if the access lines 110, 115 are considered to extend in horizontal directions (e.g., an x direction or a y direction), vias may extend in a vertical (z) direction. In some cases, one or more layers between the drivers and the access lines may include metal routing lines, which may be referred to as interconnect layers or collectively as an interconnect layer, where drivers may be coupled with corresponding lines in the interconnect layer and vias may extend between the interconnect layer and the layers that include the access lines 115. In some cases, an access line may be rendered electrically floating by a gap in the interconnect layer that isolates the access line from a corresponding driver.

In some cases, process variations when fabricating a memory device may cause the separation distance between access lines (e.g., between two bit lines or between two word lines) to vary either from device to device or from line to line within a device, which may result in unintended shorting between access lines. For example, such process variations or other unintended or unforeseen aspects of fabrication may result in at least some access lines being closer together than intended or otherwise desired. If a distance between two access lines is sufficiently small, whether intended or otherwise, shorting may occur between the access lines when accessing one of the access lines to perform a read or write operation. Similarly, shorting may occur between other structures of a memory array based on a distance between the structures, which also, for example, may vary due to process variations. Shorting between access lines or between other structures may decrease the accuracy and reliability of a memory array. The present disclosure provides methods and apparatuses for identifying such shorting, potentially during fabrication of a device (e.g., before loop ends are removed from loops used to form access lines), thereby reducing time to information for engineers and other personnel, among other benefits.

Figure 2:
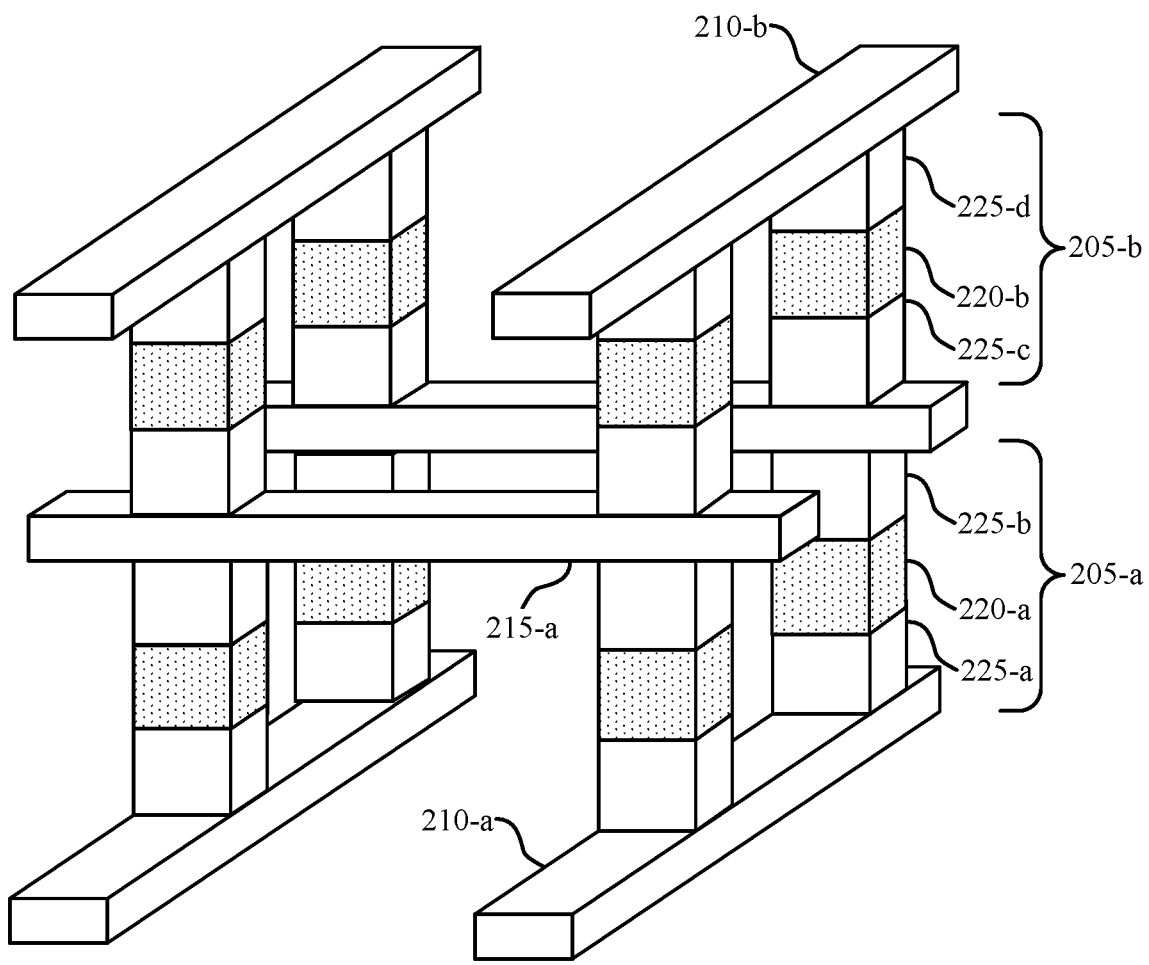
FIG. 2 illustrates an example of a cross-point memory array that supports electron beam probing techniques and related structures in accordance with examples as disclosed herein.
Figure 2:
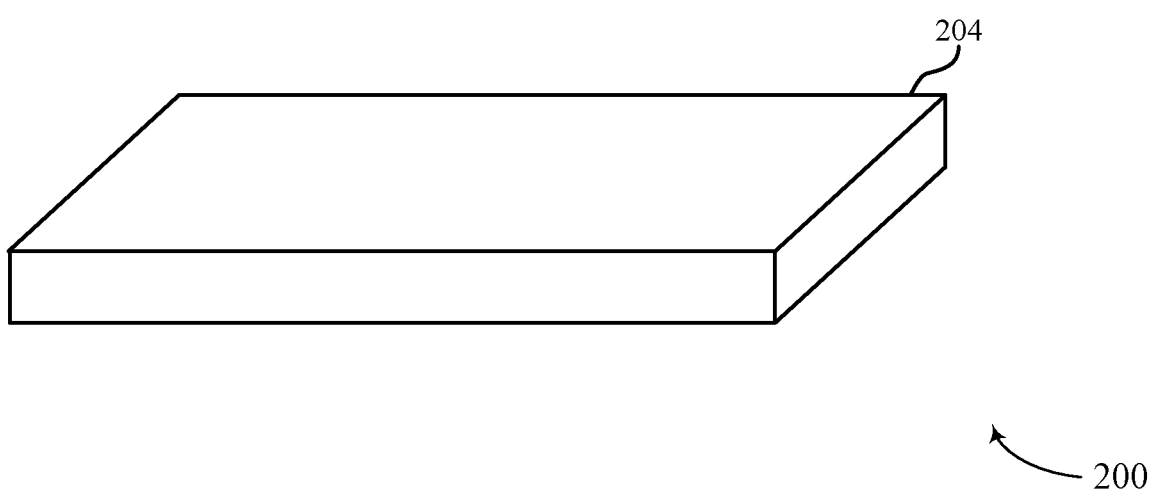

FIG. 2 illustrates an example of a 3D memory array 200 that supports electron beam probing in accordance with examples as disclosed herein. The memory array 200 may be an example of portions of a memory array 102 described with reference to FIG. 1. The memory array 200 may include a first array or deck 205-a of memory cells that is positioned above a substrate 204 and second array or deck 205-b of memory cells on top of the first array or deck 205-a. Though the example of the memory array 200 includes two decks 205-a, 205-b, it is to be understood that one deck (e.g., a 2D memory array) or more than two decks are also possible.

The memory array 200 may also include word line 210-a and word line 210-b, and bit line 215-a, which may be examples of word line 110 and bit line 115, as described with reference to FIG. 1. The word lines 210 may be coupled with one or more rows of word line sockets (not shown), and the bit lines 215 may be coupled with one or more rows of bit line sockets (not shown). Though one memory element 220 per memory cell is shown for the sake of clarity, memory cells of the first deck 205-a and the second deck 205-b each may include one or more memory elements 220 (e.g., elements comprising a memory material configurable to store information and/or provide a selection function), which may or may not be self-selecting memory elements. Although some elements included in FIG. 2 are labeled with a numeric indicator, other corresponding elements are not labeled, though they are the same or would be understood to be similar, in an effort to increase visibility and clarity of the depicted features.

Memory cells of the first deck 205-a may include first electrode 225-a, a memory element 220-a, and a second electrode 225-b. In addition, memory cells of the second deck 205-b may include a first electrode 225-c, a memory element 220-b, and a second electrode 225-d. The memory cells of the first deck 205-a and second deck 205-b may, in some examples, have common conductive lines such that corresponding memory cells of each deck 205-a and 205-b may share bit lines 215 or word lines 210 as described with reference to FIG. 1. For example, first electrode 225-c of the second deck 205-b and the second electrode 225-b of the first deck 205-a may be coupled to bit line 215-a such that bit line 215-a is shared by vertically adjacent memory cells.

In some examples, the memory element 220 may, for example, comprise a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, a memory element 220 may be included in a PCM cell and may change between crystalline and amorphous states. A memory element 220 in the crystalline state may have atoms arranged in a periodic structure, which may result in a relatively low electrical resistance (e.g., set state). By contrast, a memory element 220 in an amorphous state may have no or relatively little periodic atomic structure, which may have a relatively high electrical resistance (e.g., reset state). The difference in resistance values between amorphous and crystalline states of the memory element 220 may be significant; for example, a material in an amorphous state may have a resistance one or more orders of magnitude greater than the resistance of the material in its crystalline state. In some cases, the amorphous state may have a threshold voltage associated with it and current may not flow until the threshold voltage is exceeded. In other cases, a memory element 220 may be partially amorphous and partially crystalline, and the resistance may be of some value between the resistances of the memory element 220 in a wholly crystalline or wholly amorphous state. A memory element 220 thus may be used for other than binary logic applications—i.e., the number of possible states stored in a material may be more than two.

A memory element 220 may be switched from amorphous to crystalline and vice versa—and thus a state may be written to the memory cell that includes the memory element 220—by applying a voltage across and thus passing current through the memory element 220 so as to heat the memory element 220 beyond a melting temperature, and then removing the voltage and current according to various timing parameters configured to render the memory element 220 in the desired state (e.g., amorphous or crystalline). Heating and quenching of the memory element 220 may be accomplished by controlling current flow through the memory element 220, which in turn may be accomplished by controlling the voltage differential between the corresponding word line 210 and corresponding bit line 215.

In some cases, a memory element 220 included in a self-selecting memory cell may be operated so as to not undergo a phase change during normal operation of the memory cell (e.g., due to the composition of the memory (e.g., chalcogenide) material, and/or due to operational voltages and currents configured to maintain the memory element 220 in a single phase, such as an amorphous or glass phase). For example, the memory element 220 may include a chemical element, such as arsenic, that inhibits crystallization of a chalcogenide material and thus may remain in an amorphous state. Here, some or all of the set of logic states supported by the memory cells (e.g., including memory element 220 and electrodes 225) may be associated with an amorphous state of the memory element 220 (e.g., stored by the memory element 220 while the memory element 220 is in the amorphous state). For example, a logic state '0' and a logic state '1' may both be associated with an amorphous state of the memory element 220 (e.g., stored by the memory element 220 while the memory element 220 is in the amorphous state). In some cases, memory element 220 may be configured to store a logic state corresponding to an information bit.

During a programming (write) operation of a memory cell (e.g., including electrodes 225-a, memory element 220-a, and electrode 225-b), the polarity used for programming (writing) or whether the memory element 220 is programmed into an amorphous or crystalline state may influence (determine, set, program) a particular behavior or characteristic of the memory element 220, such as the threshold voltage of the memory element 220. The difference in threshold voltages of the memory element 220 depending on the logic state stored by the memory element 220 (e.g., the difference between the threshold voltage when the memory element 220 is storing a logic state '0' versus a logic state '1') may correspond to the read window of the memory element 220.

The architecture of memory array 200 may in some cases be referred to as a cross-point architecture, in which a memory cell is formed at a topological cross-point between a word line and a bit line as illustrated in FIG. 2. Such a cross-point architecture may offer relatively high-density data storage with lower production costs compared to at least some other memory architectures. For example, the cross-point architecture may have memory cells with a reduced area and, resultantly, an increased memory cell density compared to other architectures.

In some cases, as described elsewhere herein, access lines (e.g., word lines 110 or bit lines 115) may be formed at least in part by forming elongated loops of one or more materials (e.g., one or more materials comprising at least an access line material), wherein the loops each include two short ends and two long ends. Individual access lines may be formed by cutting or otherwise removing the short ends from the loops, leaving the two long ends as two different access lines. In some cases, loops of a composite stack of materials (e.g., of cell stack materials) may be formed and the loops may be cut to create two lines (e.g., the remaining long ends) comprising the materials of the stack. Cell stack materials may include but are not limited to materials included in first electrode layers 215, memory storage element layers 220, second electrode layers 225, and access line layers (e.g., bit lines 115, word lines 110, etc.).

Figure 3:
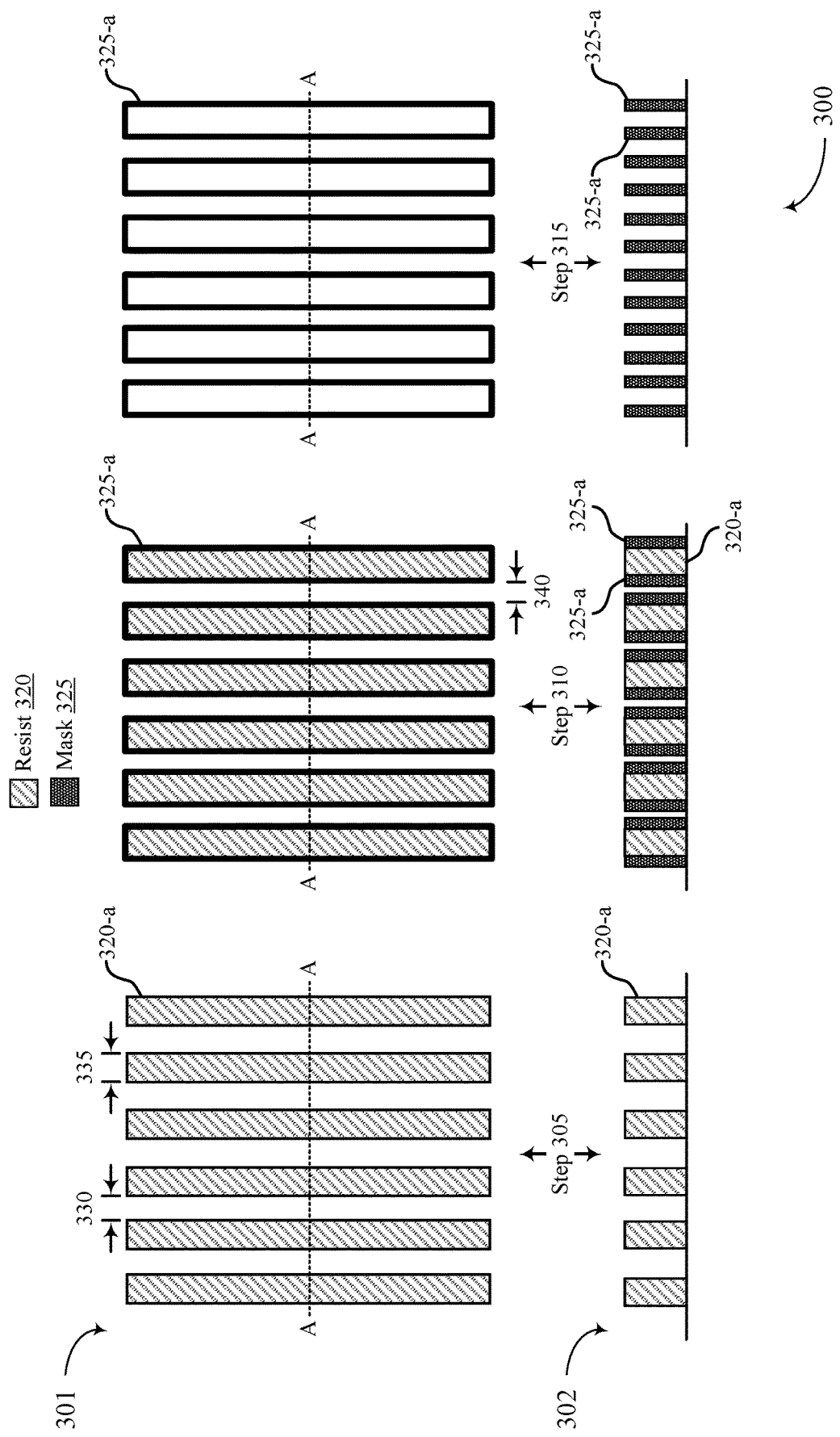
FIG. 3 illustrates an example of a method that supports electron beam probing techniques and related structures in accordance with examples as disclosed herein.

FIG. 3 illustrates an example method 300 of loop formation that supports electron beam probing techniques and related structures in accordance with examples as disclosed herein. The loops may be formed as part of forming a memory array or a memory device (e.g., a cross-point device) as described herein, such as an array or a device as described with reference to FIG. 1 or FIG. 2. In some examples, the loops may be formed of a stack of materials, a memory cell stack (e.g., a cell stack described with reference to FIG. 2). In some examples, the loops may be formed of access line material, such as an access line material that forms part of or is coupled with a memory cell stack.

FIG. 3 depicts diagrams 301 and 302. In some examples, diagram 301 may depict a top view of a stack of materials at various stages of processing, and in some examples may depict a top plane or top layer of the stack of materials. In some examples, diagram 302 may depict a cross-sectional side view (e.g., end view) of the stack of materials at the various stages of processing. For example, diagram 302 may depict a cross-sectional view perpendicular to the top view, such as a view denoted by reference line A-A.

At step 305, multiple raised shapes may be formed using a resist material 320, where the raised shapes may be formed on the top layer or plane of the stack of materials. The raised shapes may, for example, include one or more lines of resist material 320, and in some cases, the raised lines of resist material 320 may be substantially parallel to one another. Each line of resist material 320 may be separated from one or more neighboring resist lines by a distance 330. Similarly, each line of resist material 320 may have a width 335. In some cases, width 335 and distance 330 may be different, and in some cases width 335 and distance 330 may be equal.

At step 310, multiple loops may be formed on the raised shapes of resist material 320 using a mask material 325. For example, mask loops may be formed on an outside plane or surface (e.g., sidewalls) of the resist material 320. In some examples, the mask material 325 may be formed or deposited conformally on outside surfaces or sidewalls of the raised resist material 320. And in some examples, the mask material 325 may be formed on the upper surfaces of the raised lines of resist material 320 or on the surfaces between the raised lines of resist material 320 in addition to the sidewalls thereof, but the mask material may be subsequently removed (e.g., through etching, polishing, or another removal process) from surfaces other than the sidewalls of the raised lines of resist material 320. As such, portions of the mask material 325 may form loops, such as a loop that surrounds a raised line of resist material 320 (e.g., loop 325-a, which surrounds line 320-a). Loops of mask material 325 may be formed such that a distance 340 separates each loop of mask material 325 from one or more neighboring loops of mask material 325. In some cases, distance 340 may be less than distance 330 by an amount that is twice the thickness of each loop of mask material 325.

At step 315, the raised shapes of resist material 320 may be removed, for example, by using a first etching (e.g., chemically selective etching) process. The loops of mask material 325 may be left (e.g., may be unaffected by the first etching process) such that the top plane or surface of the stack of materials may include loops of mask material 325 but no longer include the raised shapes of resist material 320. The loops of mask material 325 may act as a mask during a second etching process that removes portions of the stack of materials that are not masked. In some cases, the second etching process may be included in the first etching process, or in some cases, the second etching process may be a different etching process (e.g., the second etching process may be anisotropic, while the first etching process may be isotropic). Portions of the stack masked by (e.g., underneath) the loops of mask material 325 may remain unaffected by the second etching process, while the second etching process may remove other (e.g., unmasked) portions of the stack. As such, loops of one or more materials of the stack may be formed using loops of mask material 325 (and thus having the same or substantially the same shape as the loops of mask material 325). For example, a loop of access line material may be formed, possibly as part of a loop of memory stack materials. As the long edges (straightaways) of the loops may ultimately form access lines, after the loop ends are removed, this process may result in the formation of two access lines based on a single initial raised shape (e.g., line) of resist material 320, and thus may in some cases be referred to as a pitch doubling technique.

In some cases, the raised shapes of resist material 320 may be partially removed, leaving a narrower portion of the resist material 320 within the first set of loops of mask material 325. Loops may be formed on the remaining shapes of resist material 320 using a mask material 325, thus forming a second set of loops of mask material 325 within and concentric to the first set of loops of mask material 325. This process of forming a second, concentric set of loops may be referred to as a pitch quadrupling technique, as two loops and thus four access lines may ultimately be formed based on a single initial raised shape (e.g., line) of resist material 320. As described herein, the first set of loops and the second set of loops of the mask material 325 may be used to form loops of one or more materials of the stack.

In some examples, after forming the loops of the one or more materials of the memory stack, the loops of mask material 325 may be removed (e.g., via a third etching process) to expose the upper surfaces of the loops of the one or more materials (e.g., on the top surface of the stack).

Multiple driver circuits may be formed, at least some of which may be configured to couple a subset of the loops of the one or more materials to a ground reference. For example, driver circuits may have been formed prior to step 305 below the stack of materials (e.g., in a CMOS layer below the stack of materials), and vias or other interconnect circuitry may have been formed to couple at least some of the drivers with corresponding loops of the one or more materials (e.g., by coupling at least some of the drivers with the stack of materials in locations planned to later correspond to loops formed as described with reference to FIG. 3). In some cases, grounded loops may be coupled with corresponding drivers at least in part by an interconnect layer (e.g., one or more layers of conductive (e.g., metal) routing structures above the drivers and below the loops) and non-grounded loops may be isolated from corresponding drivers by one or more gaps in the interconnect layer.

Grounded loops may be interspersed with non-grounded (e.g., floating) loops of the one or more materials, with the arrangement of grounded and non-grounded loops corresponding to one or more patterns. Example patterns of grounded and non-grounded loops are described herein with reference to FIGS. 6-8. Based on the patterns, the loops of the one or more materials may be tested for leakage between loops. For example, if leakage exists between a grounded loop and a non-grounded loop, the non-grounded loop may react to a charge in a same manner as the grounded loop and the leakage may be detected based on the reaction.

In some cases, leakage between different portions of a same loop (e.g., between straightaway portions of the loop) may be undetectable, because the loop may be continuous. For example, longer, straightaway portions of a loop may be coupled via shorter, end portions of the loop, and thus unintended shorting between different straightaways of the same loop may be undetectable. Leakage between different loops may, however, be detectable and may provide information related to spacing between loops (e.g., distance 340), which may in turn be based on spacing between raised resist materials 320 (e.g., distance 330). For example, if leakage is detected between loops, the leakage may indicate that distance 340 is undesirably narrow. As such, distance 340, corresponding distance 330, or any number of other design parameters may be enlarged or otherwise altered for subsequently fabricated devices to decrease the risk of unintended shorts. In some cases, enlarging distance 330 may include decreasing width 335 or adjusting a spacing between raised resist materials 320. In some examples, shorter ends of the loops may be cut off in order to form lines of material (e.g., lines of material stacks, access lines, etc.), while in some examples, the loops may not be cut.

Figure 4:
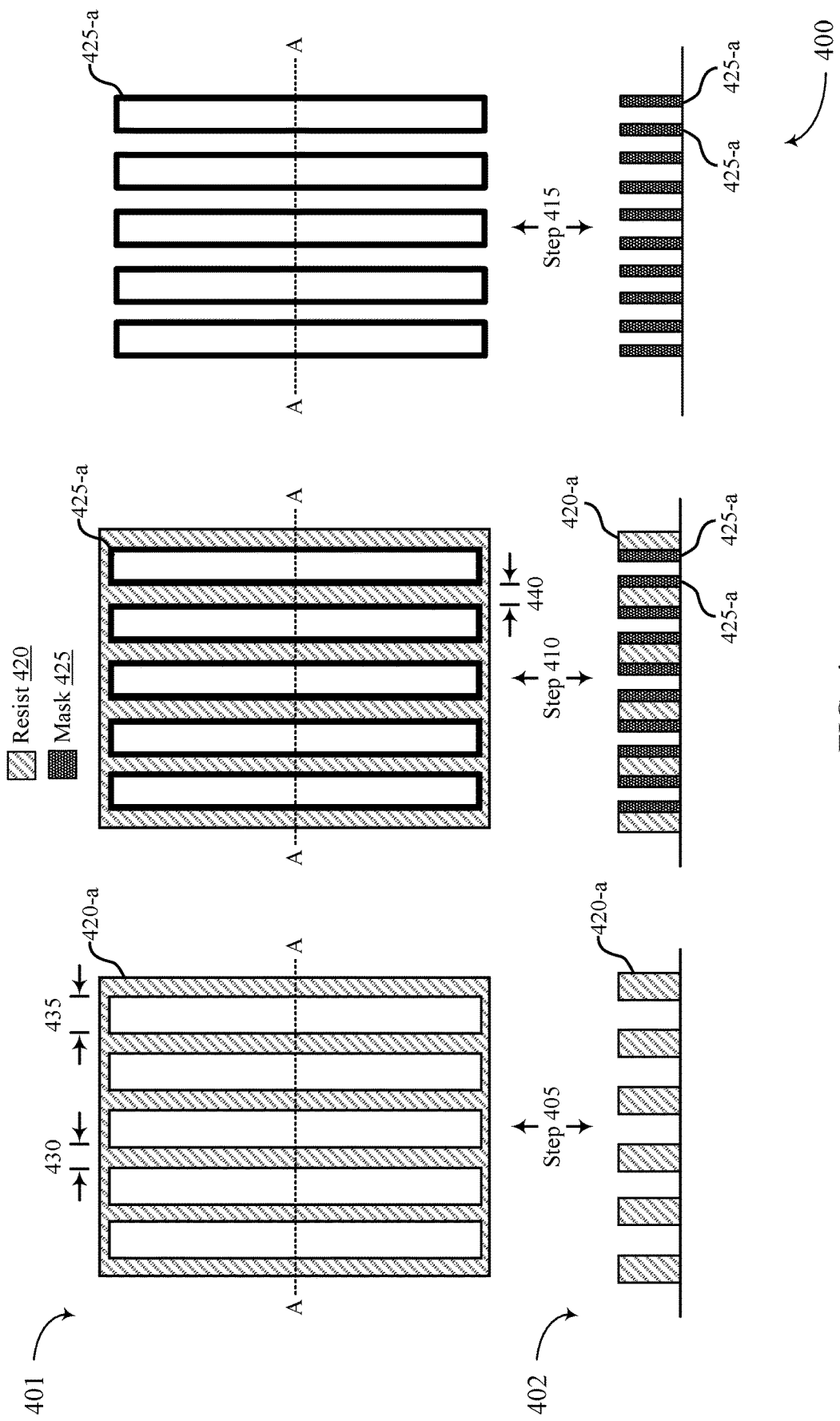
FIG. 4 illustrates an example of a method that supports electron beam probing techniques and related structures in accordance with examples as disclosed herein.

FIG. 4 illustrates an example of a method 400 of loop formation that supports electron beam probing techniques and related structures in accordance with examples as disclosed herein. The loops may be formed as part of forming a memory array or a memory device (e.g., a cross-point device) as described herein, such as an array or a device described with reference to FIG. 1 or FIG. 2. In some examples, the loops may be formed of a stack of materials, such as a stack of materials that includes one or more materials of a memory cell stack (e.g., a cell stack described with reference to FIG. 2 or elsewhere herein). In some examples, the loops may be formed of access line material, such as an access line material that forms part of a memory cell stack.

FIG. 4 depicts diagrams 401 and 402. In some examples, diagram 401 may depict a top view of a stack of materials at various stages of processing, and in some examples may depict a top plane or top layer of the stack of materials. In some examples, diagram 402 may depict a cross-sectional side view (e.g., end view) of the stack of materials at the various stages of processing. For example, diagram 402 may depict a cross-sectional view perpendicular to the top view, such as a view denoted by reference line A-A.

At step 405, multiple raised shapes may be formed using a resist material 420, where the raised shapes may be formed on the top layer or plane of the stack of materials. In some cases, the raised resist material 420 may be formed on a same wafer or die as the shapes of raised resist material 420 described with reference to FIG. 3 (e.g., in a different portion of the same wafer or die). The raised shapes may, for example, include one or more lines of resist material 420, and in some cases, the raised lines of resist material 420 may be substantially parallel to one another. In some cases, the parallel lines of resist material 420 may be aligned with a set of lines of resist material 420 described with reference to FIG. 3. The parallel lines of resist material 420 may be capped by lines of resist material 420 that are substantially perpendicular to the parallel lines, such that the raised resist material 420 may surround open trenches devoid of the resist material 420 (e.g., empty trenches). Each line of resist material 420 may have a width 430, which in some cases may be a same width as the set of lines described with reference to FIG. 3. Each line of resist material 420 may be separated from one or more neighboring resist lines by a distance 435, which may correspond to the width of a trench. In some cases, width 430 and distance 435 may be different, and in some cases width 430 and distance 435 may be equal. Though illustrated in the example of FIG. 4 as formed through an additive process (forming the surrounding raised shapes (lines)), it is to be understood that the raised shapes of resist material 420 may alternatively be formed through a subtractive process (e.g., by removing the material from the trenches, leaving the resist material corresponding to the illustrated raised shapes 420).

At step 410, multiple loops may be formed on the raised shapes of resist material 420 using a mask material 425. For example, mask loops may be formed on an inside plane or surface (e.g., sidewalls) of the resist material 420, in the trenches surrounded by the resist material 420. In some examples, the mask material 425 may be formed or deposited conformally on inside surfaces or sidewalls of the raised resist material 420. And in some examples, the mask material 425 may be formed on the upper surfaces of the raised lines of resist material 420 or on the surfaces between the raised lines of resist material 420 in addition to the sidewalls thereof, but the mask material may be subsequently removed (e.g., through etching, polishing, or another removal process) from surfaces other than the sidewalls of the raised lines of resist material 420. As such, portions of the mask material 425 may form loops, such as a loop surrounded by resist material 420 (e.g., loop 425-a, which is surrounded by resist material 420), which may in some cases be alternatively conceptualized as a loop that surrounds a trench. Loops of mask material 425 may be formed such that a distance 440 separates each loop of mask material 425 from one or more neighboring loops of mask material 425. In some cases, distance 440 may be less than distance 430 by an amount that is twice the thickness of each loop of mask material 425.

At step 415, the raised shapes of resist material 420 may be removed, for example, by using processes similar to that described with reference to FIG. 3 (e.g., a first etching process). As described with reference to FIG. 3, portions of the stack masked by (e.g., underneath) the loops of mask material 425 may remain unaffected by a second etching process, while the second etching process may remove other (e.g., unmasked) portions of the stack. As such, loops of one or more materials of the stack may be formed using loops of mask material 425 (and thus having the same or substantially the same shape as the loops of mask material 425). For example, a loop of access line material may be formed, possibly as part of a loop of memory stack materials. As the long edges (straightaways) of the loops may ultimately form access lines, after the loop ends are removed, this process may result in the formation of two access lines based on a single initial raised shape (e.g., line) of resist material 420, and thus may in some cases be referred to as a pitch doubling technique.

In some cases, the raised shapes of resist material 420 may be partially removed, leaving a narrower portion of the resist material 420 outside of the first set of loops of mask material 425. Loops may be formed on the remaining shapes of resist material 420 using a mask material 425, thus forming a second set of loops of mask material 425 surrounding and concentric to the first set of loops of mask material 425. This process of forming a second, concentric set of loops may be referred to as a pitch quadrupling technique, as two loops and thus four access lines may ultimately be formed based on a single initial raised shape (e.g., line) of resist material 420. As described herein, the first set of loops and the second set of loops of the mask material 425 may be used to form loops of one or more materials of the stack.

As described with reference to FIG. 3, the loops of mask material 425 may be removed (e.g., via a third etching process) to expose the upper surfaces of the loops of the one or more materials (e.g., on the top surface of the stack). Similarly, multiple driver circuits may be formed, at least some of which may be configured to couple a subset of the loops of the one or more materials to a ground reference, while a second subset of loops may be isolated from the ground reference.

Grounded loops may be interspersed with non-grounded (e.g., floating) loops of the one or more materials, with example patterns of grounded and non-grounded loops described herein with reference to FIGS. 6-8. Based on the patterns, the loops of the one or more materials may be tested for leakage between loops, as described with reference to FIG. 3.

In some cases, leakage between different portions of a same loop (e.g., between straightaway portions of the loop) may be undetectable, because the loop may be continuous. For example, longer, straightaway portions of a loop may be coupled via shorter, end portions of the loop, and thus unintended shorting between different straightaways of the same loop may be undetectable. Leakage between different loops may, however, be detectable and may provide information related to spacing between loops (e.g., distance 440), which may in turn be based on the width of the raised resist materials 420 (e.g., width 430). For example, if leakage is detected between loops, the leakage may indicate that width 430 is undesirably narrow. As such, distance 440, corresponding width 430, or any number of other design parameters may be enlarged or otherwise altered for subsequently fabricated devices to decrease the risk of unintended shorts. In some cases, enlarging distance 440 may include increasing width 430, decreasing distance 435, or otherwise adjusting a spacing between raised resist materials 420. In some examples, shorter ends of the loops may be cut off in order to form lines of material (e.g., lines of material stacks, access lines, etc.), while in some examples, the loops may not be cut.

Figure 5:
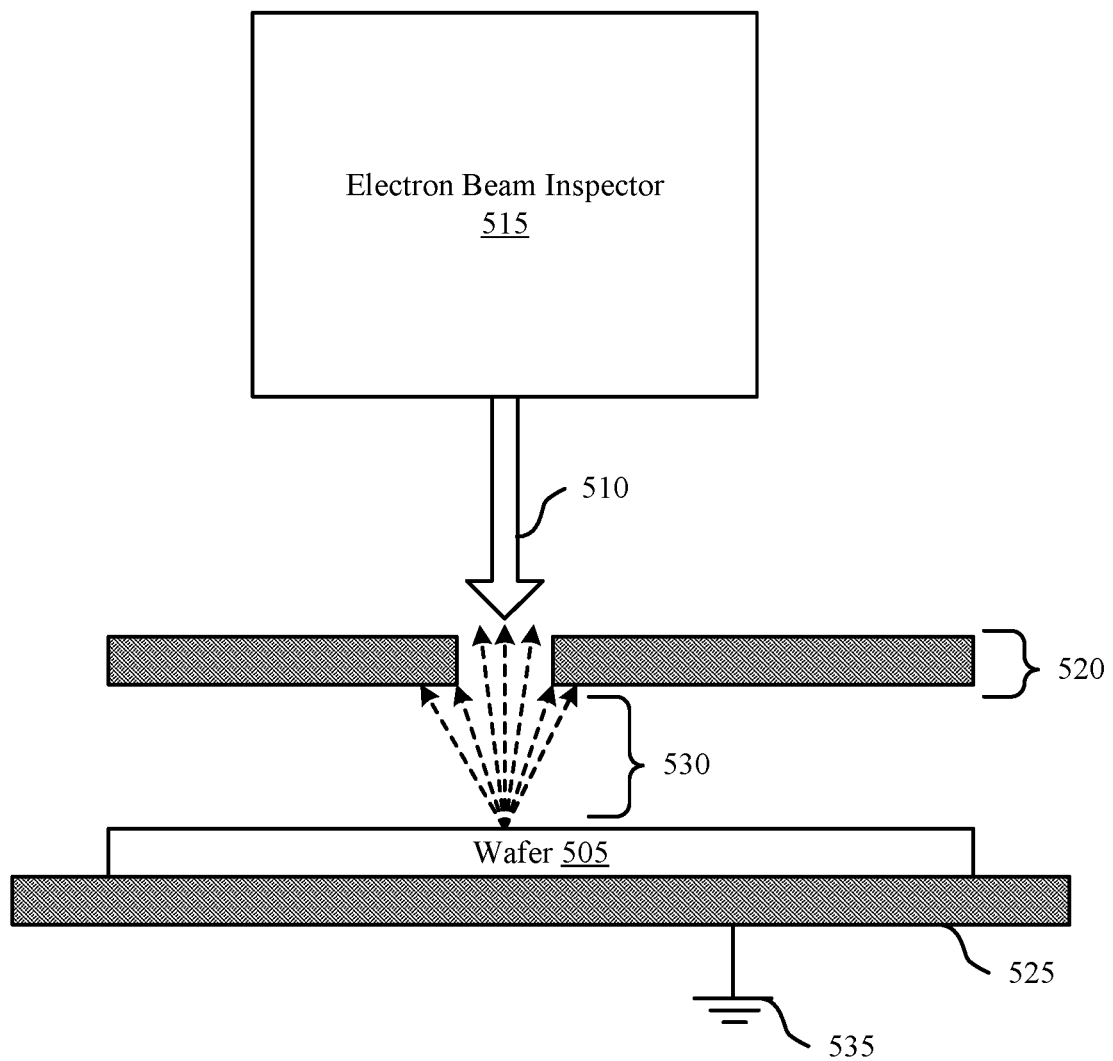
FIG. 5 illustrates an example of a method that supports electron beam probing techniques and related structures in accordance with examples as disclosed herein.

FIG. 5 illustrates a side view of an example method 500 that supports non-contact measurement of memory cell threshold voltage in accordance with examples as disclosed herein. Method 500 may include scanning a wafer 505 (e.g., a silicon wafer)—which may include an apparatus in accordance with the teachings herein—with an electron beam 510.

The electron beam 510 may be generated by an electron beam inspector (EBI) 515. The EBI 515 may in some cases be a Hermes Micro Vision EBI. The EBI 515 may include a Wehnelt electrode 520 and a stage 525. The stage 525 may be coupled with or may otherwise serve as a ground reference 535. The Wehnelt electrode 520 may create a positive or negative voltage potential relative to the stage 525, and thus may either attract or repel scattered electrons 530 that may be extracted from the wafer 505. The EBI 515 may have image analysis capabilities and may in some cases support voltage contrasting techniques.

The wafer 505 may be configured such that one or more access lines or access line loops as described herein may be scanned by the electron beam 510 (e.g., may be exposed at the upper surface of the wafer 505). The wafer 505 may also be configured such that a substrate of the wafer 505 is in contact with the stage 525 or otherwise coupled with the ground reference 535.

In some cases, method 500 may occur when the wafer 505 is at an intermediate stage of fabrication. For example, method 500 may occur during a fabrication step at which one or more decks 505 of memory cells 105 and access lines have been at least partially fabricated and after which one or more additional fabrication steps may occur (e.g., one or more additional decks 505 of memory cells 105 and access lines may be fabricated, or one or more other layers may be formed on the wafer 505). For example, method 500 may occur after forming access line loops and before cutting the ends of the access line loops to form access lines.

In some cases, the difference in voltage potential between the electron source within EBI 515 (the source of the electron beam 510) and the stage 525 may dictate the landing energy of electrons within the electron beam 510 upon the surface of the wafer 505. The electron beam 510 may generate a number scattered electrons 530 at a scanned location (e.g., localized spot) on the surface of the wafer 505, which may include back scattered electrons and secondary electrons, based upon the landing energy of electrons within the electron beam 510 (and thus upon the difference in voltage potential between the electron source within EBI 515 and the stage 525) and the characteristics of the scanned surface material of the wafer 505. For example, difference surface materials may have different electron yield (σ) characteristics (e.g., extracted electron count/incident electron count) at different levels of landing energy (e.g., as measured in electronvolts (eV)) for the electron beam 510.

If the Wehnelt electrode 520 is configured to have a positive voltage potential relative to the stage 525 (and thus to the ground reference 535), then the Wehnelt electrode 520 may attract the scattered electrons 530. Thus, if the landing energy of the electron beam 510 is sufficient to have an electron yield greater than 1 (σ>1), and the Wehnelt electrode 520 is configured to have a positive voltage, then the EBI 515 may act in an extraction mode, as more electrons (e.g., scattered electrons 530) may be extracted from the wafer 505 than are inserted into the wafer 505 by the electron beam 510. This net loss of electrons at the scanned location of the surface of the wafer 505 may result in a positive voltage at the scanned location of the surface of the wafer 505 relative to the stage 525 and the ground reference.

Thus, in some cases, current may flow from a scanned location on the surface of the wafer 505 to the ground reference 535 so long as a conductive path exists between the scanned location on the surface of the wafer 505 and the ground reference 535. (e.g., between an access line or access line loop at the surface of the wafer 505 and the ground reference 535). If a conductive path does not exist between the scanned location on the surface of the wafer 505 and the ground reference 535, then and the scanned location on the surface of the wafer 505 may not emit scattered electrons 530

Conversely, if the Wehnelt electrode 520 is configured to have a negative voltage potential relative to the stage 525 (and thus to the ground reference 535), then the Wehnelt electrode 520 may repel the scattered electrons 530 back to the wafer 505. Thus, the electrons inserted into the wafer 505 by the electron beam 510 may cause a net gain of electrons at the scanned location of the surface of the wafer 505, resulting in a negative voltage at the scanned location of the surface of the wafer 505 relative to the stage 525 and the ground reference. Thus, in some cases, current may flow from the ground reference 535 to the scanned location on the surface of the wafer 505 so long as a conductive path exists between the scanned location on the surface of the wafer 505 and the ground reference 535. (e.g., between an access line or access line loop at the surface of the wafer 505 and the ground reference 535).

In some cases, EBI 515 may include a beam deflector, and the beam deflector may be configured to direct the electron beam 510 to be incident upon a particular location on the surface of the wafer 505. In some cases, the beam deflector may be configured to direct the electron beam 510 to be incident upon a particular location on the surface of the wafer 505 for a particular amount of time, which may be referred to as a dwelling time.

The electron beam 510 may be targeted to specific locations on the top surface of the wafer 505 (either by directing the electron beam 510 or by positioning (e.g., moving) the wafer 505) corresponding to exposed floating access lines or access line loops. The surface voltage at a scanned location on the surface of the wafer 505 may be configured by configuring the landing energy of the electron beam 510 (that is, by configuring EBI 515 to generate the electron beam 510 so as to have a desired landing energy) or, alternatively or additionally, by configuring the voltage of the Wehnelt electrode 520 relative to the stage 525. Voltage contrasting or other techniques, such as other image analysis techniques, may be used to determine whether scanning a floating access line or access line loop causes current to flow between the scanned access line or access line loop and the ground reference 535. Current flowing between the scanned access line or access line loop and the ground reference 535 may be indicative that leakage is occurring between the scanned access line or access line loop and a neighboring, grounded access line or access line loop.

Figure 6A:
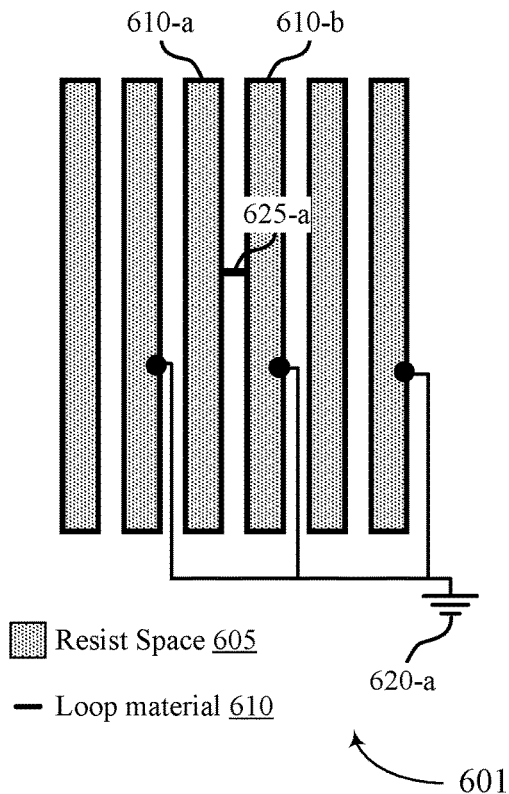
FIGS. 6A through 6D illustrate examples of circuits that support electron beam probing techniques and related structures in accordance with examples as disclosed herein.
Figure 6B:
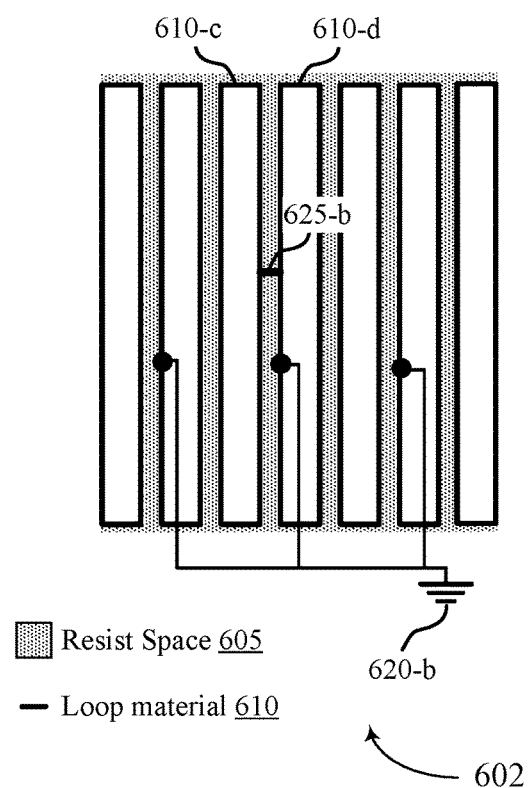
Figure 6C:
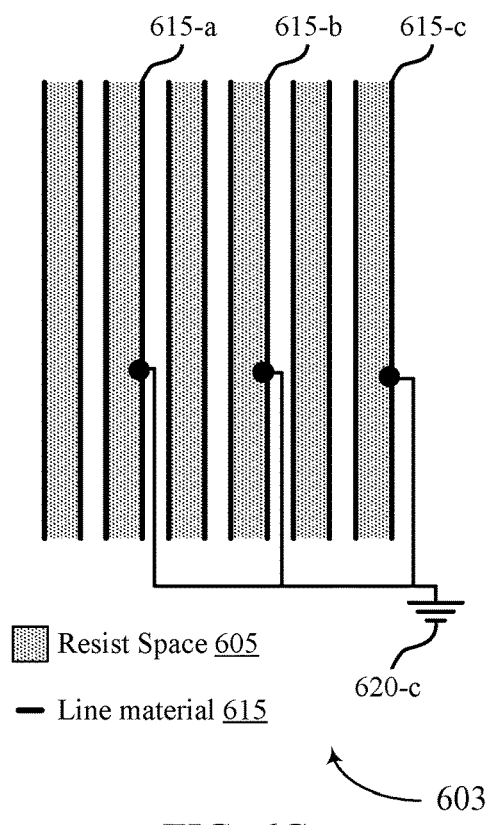
Figure 6D:
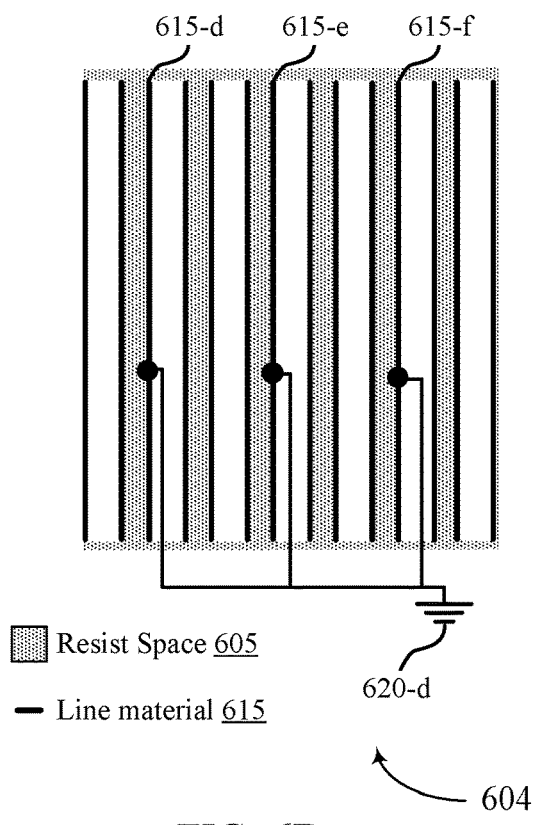

FIGS. 6A through 6D illustrate examples of circuits 601, 602, 603, and 604 that support electron beam probing techniques and related structures in accordance with examples as disclosed herein. As described with reference to FIGS. 3 and 4, loops of one or more materials (e.g., loops of a conductive material, such as an access line material, or one or more memory stack materials, which may include the access line material) may be formed, some of which may be coupled with a ground reference via one or more corresponding driver circuits. FIGS. 6A and 6B illustrate a pattern of grounded loops 610 and floating loops 610. The loops 610 may include an access line material, possibly as part of a stack of cell stack materials, and the grounded loops 610 may be coupled with a ground reference 620 via driver circuits. FIGS. 6C and 6D illustrate a pattern of grounded and floating lines 615, the lines 615 created by cutting the ends off the loops 610 shown in FIGS. 6A and 6B, as described with reference to FIGS. 3 and 4.

FIGS. 6A and 6C may illustrate circuits that are formed according to the methods described with reference to FIG. 3, where loops 610 are formed to be aligned with outside edges of lines of resist material. FIGS. 6B and 6D may illustrate circuits that are formed according to methods described with reference to FIG. 4, where loops 610 are formed to be aligned with inside edges of trenches within resist material. Resist spaces 605 may illustrate locations above or below where raised resist material was formed and subsequently removed from the stack of materials.

As illustrated in FIGS. 6A and 6B, every other loop 610 may be grounded, and remaining loops 610 may be floated. Such a pattern may apply to loops 610 constructed using either or both methods described with reference to FIG. 3 or FIG. 4. After constructing the loops 610, a scanning process may be performed as described with reference to FIG. 5. Where no unintended leakage paths exist, the pattern of grounded loops 610 may result in every other loop 610 (e.g., grounded loops 610) showing up as a bright image, with remaining loops showing as dark images. Thus, this optical pattern may indicate the absence of leakage between loops 610, while any other pattern may indicate an unintended leakage 625 (e.g., a short). In some cases, the optical pattern may be a digital or other electronic representation of an optical pattern (e.g., may not be a visual image). For example, the optical pattern may be analyzed using computer-based analysis where computer data (e.g., bits in a bitmap or in an array) is used to represent the optical pattern acquired using electron beam scanning.

Circuit 601 may support detection of leakages 625 between loops 610 (e.g., due to process variations or design choices related to the formation of circuit 601), where leakage 625 may occur in areas originally devoid of resist material, such as a leakage 625-*a* (e.g., between loops 610-*a* and 610-*b*). In a similar fashion, circuit 602 may support detection of leakage 625 between loops 610 (e.g., due to process variations or design choices related to the formation of circuit 601), where the leakage 625 may occur in areas that formerly included resist material (e.g., resist spaces 605), such as leakage 625-*b* (e.g., between loops 610-*c* and 610-*d*). Both circuits 601 and 602 may therefore be scanned to detect leakage 625 both in areas originally devoid of resist material and in areas formerly including resist material. As such, two distance or spacing values may be tested for leakage effects, where the two distance values may include a spacing between resist materials and a width of resist materials. As described with reference to FIGS. 3 and 4, one or both of these distance values or any number of other design parameters may be adjusted if leakage 625 is detected in the respective circuit.

In some cases, after scanning circuits 601 and 602 to detect leakage, the end portions of loops 610 may be cut or removed to form lines 615 (e.g., as part of a process that forms access lines for a memory device, where the access lines may in some cases be located in a different portion of the wafer, die, or device). These lines 615 are illustrated with reference to FIGS. 6C and 6D. The driver circuits and ground reference 620 may remain in place, such that, with the loop ends removed, every fourth line 615 may be grounded via a driver circuit. For example, lines 615-*a*, 615-*b*, 615-*c*, 615-*d*, 615-*e*, and 615-*f* may be grounded to one of ground reference 620-*c* or 620-*d* and other lines 615 may be left floating.

Figure 7A:
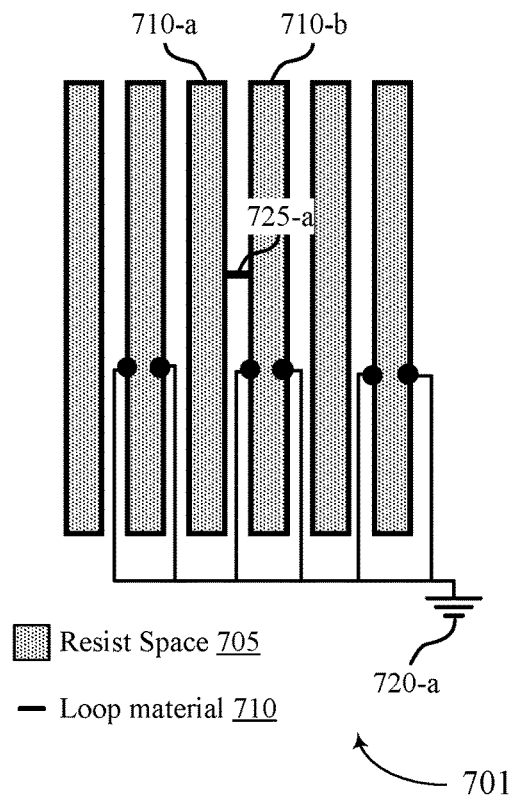
FIGS. 7A through 7D illustrate examples of circuits that support electron beam probing techniques and related structures in accordance with examples as disclosed herein.
Figure 7B:
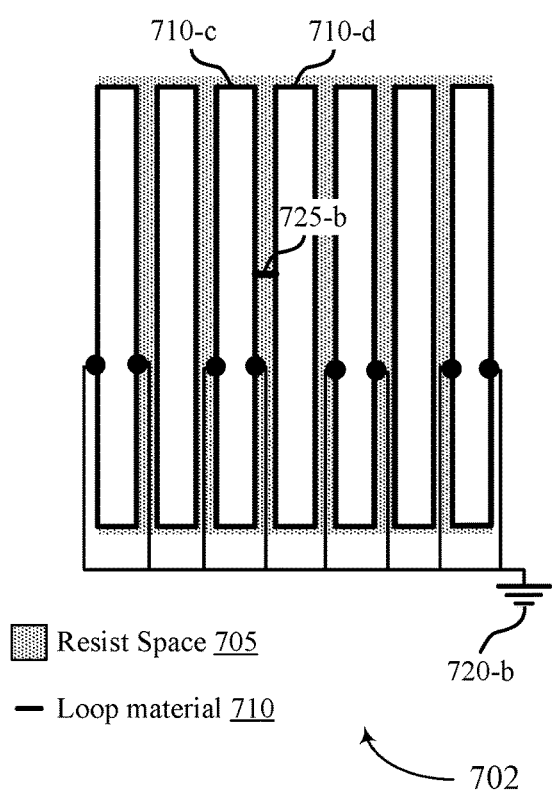
Figure 7C:
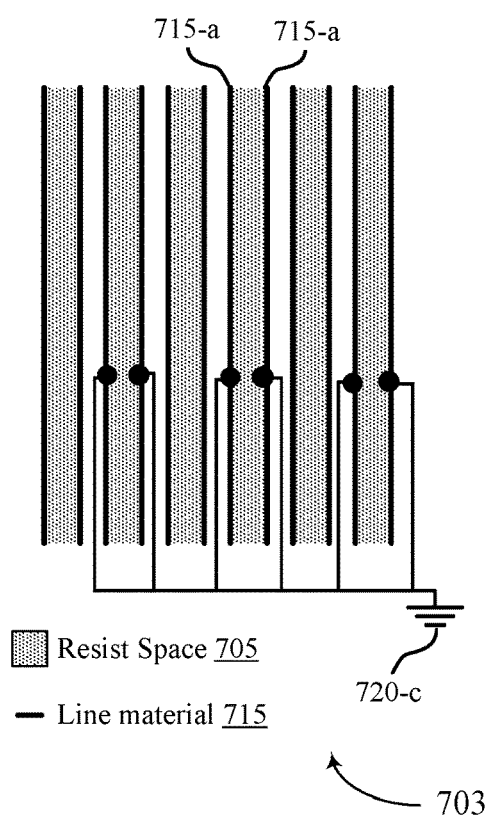
Figure 7D:
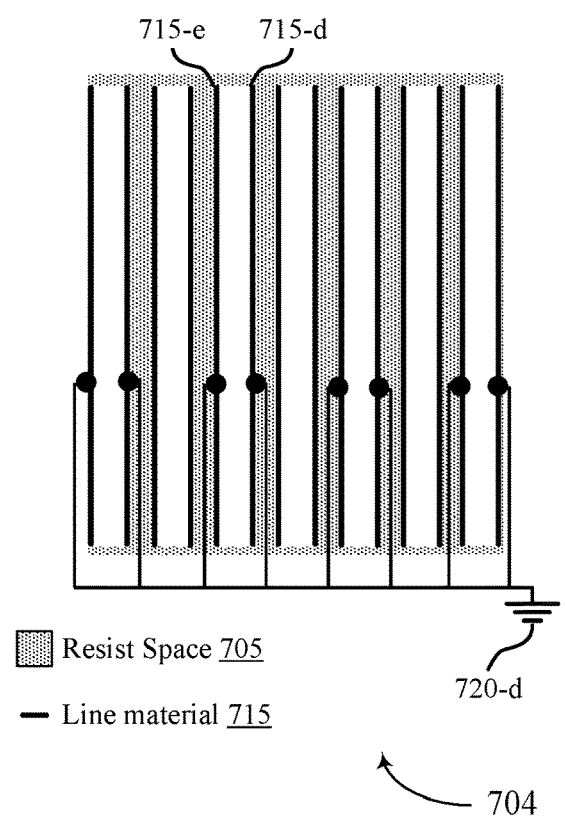

FIGS. 7A through 7D illustrate example of circuits 701, 702, 703, and 704 that support electron beam probing techniques and related structures in accordance with examples as disclosed herein. As described with reference to FIGS. 3 and 4, loops of one or more materials (e.g., loops of a conductive material, such as an access line material, or one or more memory stack materials, which may include the access line material) may be formed, some of which may be coupled with a ground reference via one or more corresponding driver circuits. FIGS. 7A and 7B illustrate a pattern of grounded loops 710 and floating loops 710, The loops 710 may include an access line material, possibly as part of a stack of cell stack materials, and the grounded loops 710 may be coupled with a ground reference 720 via driver circuits. FIGS. 7C and 7D illustrate a pattern of grounded and floating lines 715, the lines 715 created by cutting the ends off the loops 710 shown in FIGS. 7A and 7B, as described with reference to FIGS. 3 and 4.

FIGS. 7A and 7C may illustrate circuits that are formed according to the methods described with reference to FIG. 3, where loops 710 are formed to be aligned with outside edges of lines of resist material. FIGS. 7B and 7D may illustrate circuits that are formed according to methods described with reference to FIG. 4, where loops 710 are formed to be aligned with inside edges of trenches within resist material. Resist spaces 705 may illustrate locations above or below where raised resist material was formed and subsequently removed from the stack of materials.

As illustrated in FIGS. 7A and 7B, every other loop 710 may be grounded via two connections, and remaining loops 710 may be floated. Such a pattern may apply to loops 710 constructed using either or both methods described with reference to FIG. 3 or FIG. 4. After constructing the loops 710, a scanning process may be performed as described with reference to FIG. 5. Where no unintended leakage paths exist, the pattern of grounded loops 710 may result in every other loop 710 (e.g., grounded loops 710) showing up as a bright image, with remaining loops showing as dark images. Thus, this optical pattern may indicate the absence of leakage between loops 710, while any other pattern may indicate an unintended leakage 725 (e.g., a short). In some cases, the optical pattern may be a digital or other electronic representation of an optical pattern (e.g., may not be a visual image). For example, the optical pattern may be analyzed using computer-based analysis where computer data (e.g., bits in a bitmap or in an array) is used to represent the optical pattern acquired using electron beam scanning.

As described with reference to FIG. 6, circuits 701 and 702 may both be scanned to detect leakage 725 (e.g., due to process variations or design choices related to the formation of circuits 701 and 702) in areas originally devoid of resist material (e.g., leakage 725-*a*) or in areas formerly including resist material (e.g., leakage 725-*b*). As such, the spacing between resist materials and the width of resist materials may both be tested for leakage, and one or both of these values or any number of other design parameters may be adjusted if leakage 725 is detected in the respective circuit.

In some cases, after scanning circuits 701 and 702 to detect leakage, the end portions of loops 710 may be cut or removed to form lines 715 (e.g., as part of a process that forms access lines for a memory device, where the access lines may in some cases be located in a different portion of the wafer, die, or device). These lines 715 are illustrated with reference to FIGS. 7C and 7D. The driver circuits and ground reference 720 may remain in place, such that, with the loop ends removed, two lines 715 may be grounded via a driver circuit, followed by two lines 715 which may be left floating, which pattern may repeat. For example, lines 715-*a* and 715-*b* may originally pertain to loop 710-*b* and may both be grounded to ground reference 720-*c*, while the preceding two lines 715 and following two lines 715 may be left floating. Similarly, lines 715-*c* and 715-*d* may originally pertain to loop 710-*c* and may both be grounded to ground reference 720-*d*, while the preceding two lines 715 and following two lines 715 may be left floating.

Figure 8A:
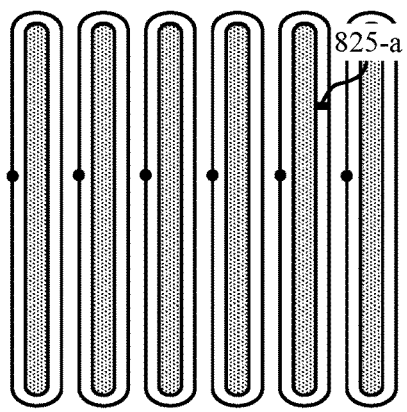
Figure 8B:
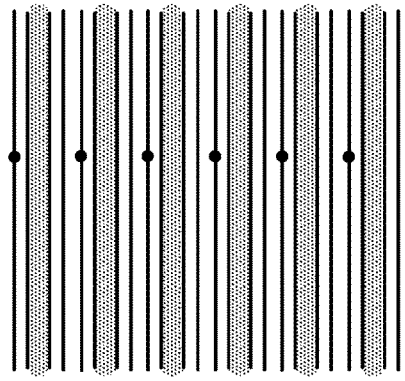
Figure 8C:
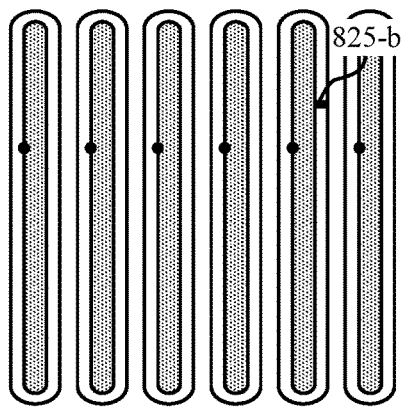
Figure 8D:
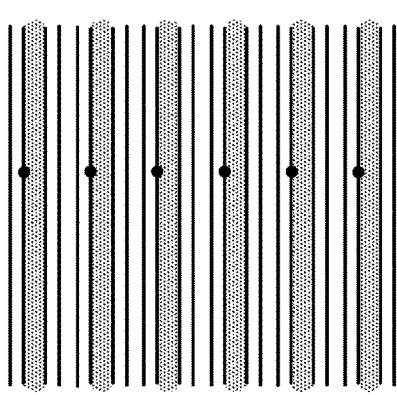

FIGS. 8A through 8G illustrate examples of circuits 801, 802, 803, 804, 805, 806, and 807 that support electron beam probing techniques and related structures in accordance with examples as disclosed herein. As described with reference to FIGS. 3 and 4, pitch quadrupling (or other techniques) may be used to form concentric loops of one or more materials (e.g., loops of a conductive material, such as an access line material, or one or more memory stack materials, which may include the access line material). Some of these loops may be coupled with a ground reference via one or more corresponding driver circuits. FIGS. 8A, 8C, 8E, and 8F illustrate a pattern of grounded loops 810 and floating loops 810. The loops 810 may include an access line material, possibly as part of a stack of cell stack materials, and the grounded loops 810 may be coupled with a ground reference via one or more ground connections 820 (e.g., and via one or more driver circuits). FIGS. 8B, 8D, and 8G illustrate a pattern of grounded and floating lines 815, the lines 815 created by cutting the ends off the loops 810 shown in FIGS. 8A, 8C, 8E and 8F, as described with reference to FIGS. 3 and 4.

FIGS. 8A, 8C, and 8E may illustrate circuits that are formed according to the methods described with reference to FIG. 3, where loops 810 are formed to be aligned with outside edges of lines of resist material. FIG. 8F may illustrate a circuit formed according to methods described with reference to FIG. 4, where loops 810 are formed to be aligned with inside edges of trenches within resist material. Resist spaces 805 may illustrate locations above or below where raised resist material was formed and subsequently removed from the stack of materials.

In some cases, as illustrated in FIG. 8A, outer loops 810 may be grounded and inner loops 810 may be floated. In some cases, as illustrated in FIG. 8C, inner loops 810 may be grounded and outer loops 810 may be floated. Either or both of these patterns may apply to loops 810 constructed using the methods described with reference to FIG. 3 or FIG. 4. After constructing the loops 810, a scanning process may be performed as described with reference to FIG. 5. Where no unintended leakage paths exist, the pattern of grounded loops 810 may result in either the outer or inner loops 810 (e.g., grounded loops 810) showing up as a bright image, and remaining loops 810 showing as dark images. Thus, this optical pattern may indicate the absence of leakage 825 between loops 810, while any other pattern may indicate an unintended leakage 825 (e.g., a short due to process variations or design choices related to the formation of circuits 801 or 803). In some cases, the optical pattern may be a digital or other electronic representation of an optical pattern (e.g., may not be a visual image). For example, the optical pattern may be analyzed using computer-based analysis where computer data (e.g., bits in a bitmap or in an array) is used to represent the optical pattern acquired using electron beam scanning.

Either of circuits 801 or 803 may indicate leakage 825 between inner and outer loops (e.g., leakage 825-*a* or 825-*b*). If leakage 825 is detected, a distance between inner and outer loops (e.g., the distance based on a first etch of resist material, as described with reference to FIGS. 3 and 4) may be adjusted accordingly.

In some cases, as illustrated in FIGS. 8E and 8F, every other outer loop 810 and its corresponding inner loop 810 may be grounded and remaining loops 810 may be floated. This pattern may apply to loops 810 constructed using the methods described with reference to FIG. 3 or FIG. 4, where FIG. 8E may correspond to the methods described with reference FIG. 3 and FIG. 8F may correspond to the methods described with reference to FIG. 4. After constructing the loops 810, a scanning process may be performed as described with reference to FIG. 5. Where no unintended leakage paths exist, the pattern of grounded loops 810 in circuits 805 and 806 may result in every other outer/inner loop set 810 (e.g., grounded loops 810) showing up as a bright image, with remaining loops 810 showing as dark images. Thus, this optical pattern (e.g., corresponding digital or other electronic representation) may indicate the absence of leakage 825 between loops 810, while any other pattern may indicate an unintended leakage 825 (e.g., a short due to process variations or design choices related to the formation of circuits 805 or 806). Such leakage 825 may represent leakage 825 between neighboring outer loops 810 (e.g., leakage 825-*c* or 825-*d*).

If leakage 825 is detected, the distance between outer loops 810 (e.g., based on a spacing between resist materials or on a resist material width) or any number of other design parameters may be adjusted accordingly. For example, if leakage 825 is detected between outer loops 810 in a circuit similar to circuit 805 of FIG. 8E (e.g., leakage 825-*c* is detected), the leakage 825 may indicate that the spacing between resist materials or lines is too small, and the spacing may be adjusted accordingly. Similarly, if leakage 825 is detected between outer loops 810 in a circuit similar to circuit 806 of FIG. 8F (e.g., leakage 820-*d* is detected), the leakage 825 may indicate that the width of resist materials or lines is too small, and the width may be adjusted accordingly. Thus, the spacing between resist materials and the width of resist materials may both be tested and adjusted.

In some cases, after scanning circuits to detect leakage, the end portions of loops 810 may be cut or removed to form lines 815 (e.g., as part of a process that forms access lines for a memory device, where the access lines may in some cases be located in a different portion of the wafer, die, or device). These lines 815 are illustrated with reference to FIGS. 8B, 8D, and 8G, where FIG. 8B corresponds to FIG. 8A, FIG. 8D corresponds to FIG. 8C, and FIG. 8G corresponds to either or both of FIGS. 8E and 8F. The driver circuits and ground connections 820 may remain in place, such that, with the loop ends removed, a pattern of grounded and floated lines 815 may exist. For example, with reference to FIGS. 8B and 8D, one grounded line 815 may be followed or preceded by three floating lines 815, in a repeating pattern. Similarly, with reference to FIG. 8G, two grounded lines 815 may be followed or preceded by two floating lines 815, in a repeating pattern.

Figure 9:
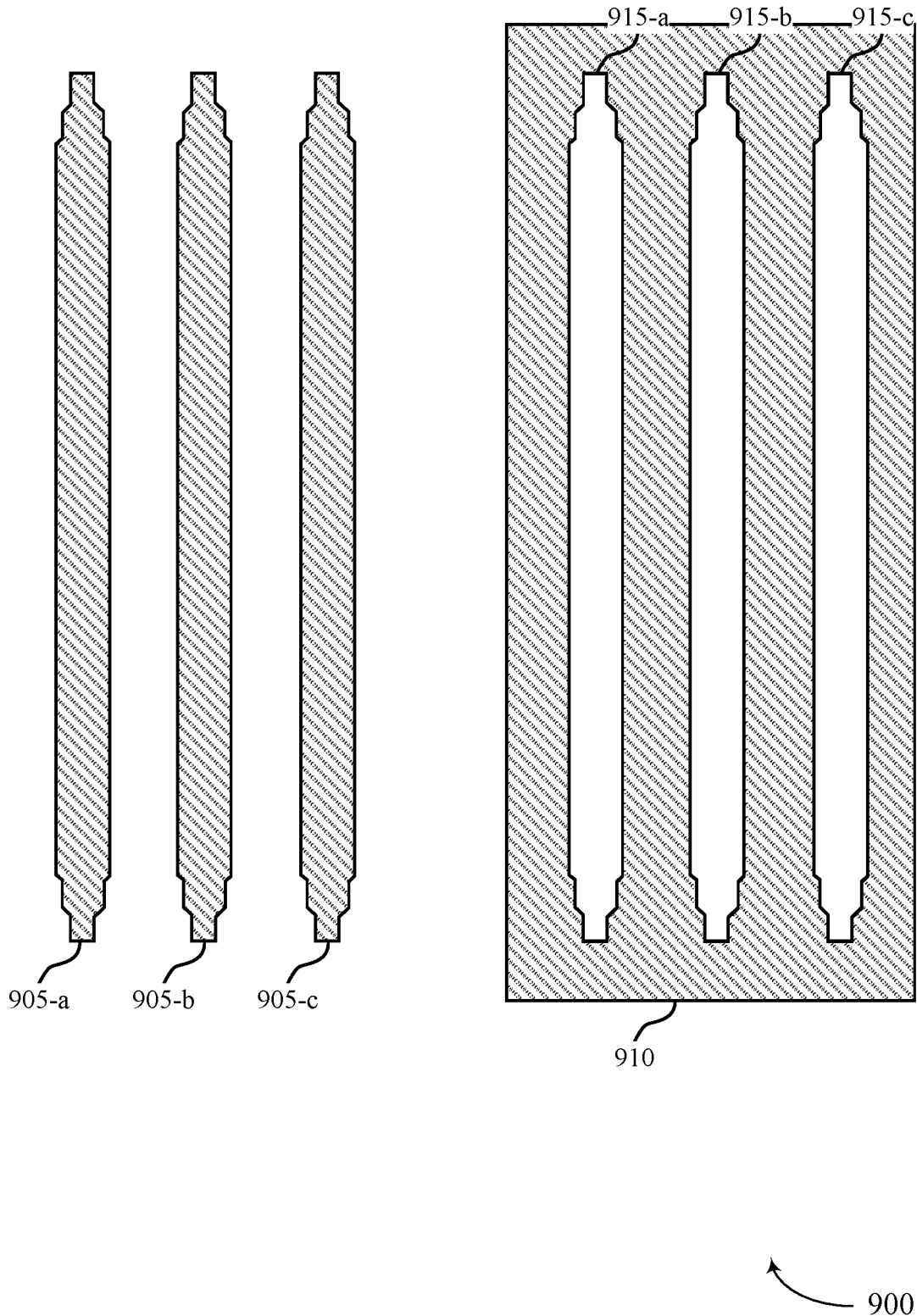
FIG. 9 illustrates an example of a memory device structure that supports electron beam probing techniques and related structures in accordance with examples as disclosed herein.

FIG. 9 illustrates an example of a memory device structure 900 that supports electron beam probing techniques and related structures in accordance with examples as disclosed herein. Memory device structure 900 may represent raised resist shapes that are formed on a top surface of a material stack, as described with reference to FIGS. 3-8.

Resist lines 905-*a*, 905-*b*, and 905-*c* may represent raised resist lines 905 as described with reference to FIG. 3, but with an alternative shape. Resist lines 905 may be used to form loops of one or more cell stack materials aligned with the outside edges of the resist material. Resist shape 910 may represent raised resist lines 905 that are capped at the end, such that resist shape 910 surrounds open trenches 915 devoid of resist material, where the trenches have an alternative shape relative to those described with reference to FIG. 4. Resist shape 910 may be used to form loops of one or more cell stack materials aligned with the inside edges of the resist material (e.g., aligned with the edges of trenches 915-*a*, 915-*b*, and 915-*c*).

In some cases, leakage may occur between two or more loop ends (e.g., shorter sides) and such leakage may be detected in a scanning process, such as the processes described with reference to FIGS. 5-8. However, in some examples, loop ends may be removed or chopped off after scanning, to form access lines, such that the final memory device may not include analogous loop ends and may therefore not experience leakage at the loop ends. As such, leakage detection at the loop ends may be considered a false positive leakage detection. Resist lines 905 and resist shapes 910 may therefore have slightly altered shapes relative to those described with reference to FIGS. 3 and 4, where the altered shapes may be configured to decrease false positive leakage detection at loop ends. For example, as illustrated in FIG. 9, ends of the resist lines 905 may be tapered or necked, such that loop ends constructed using the resist lines 905 may be farther from each other and thus less likely to experience end-to-end leakage. Similarly, ends of the trenches 915 may be tapered, or the resist shape 910 may have a bulge, such that loop ends constructed using the resist shapes 910 may be farther from each other and thus less likely to experience end-to-end leakage.

Figure 10:
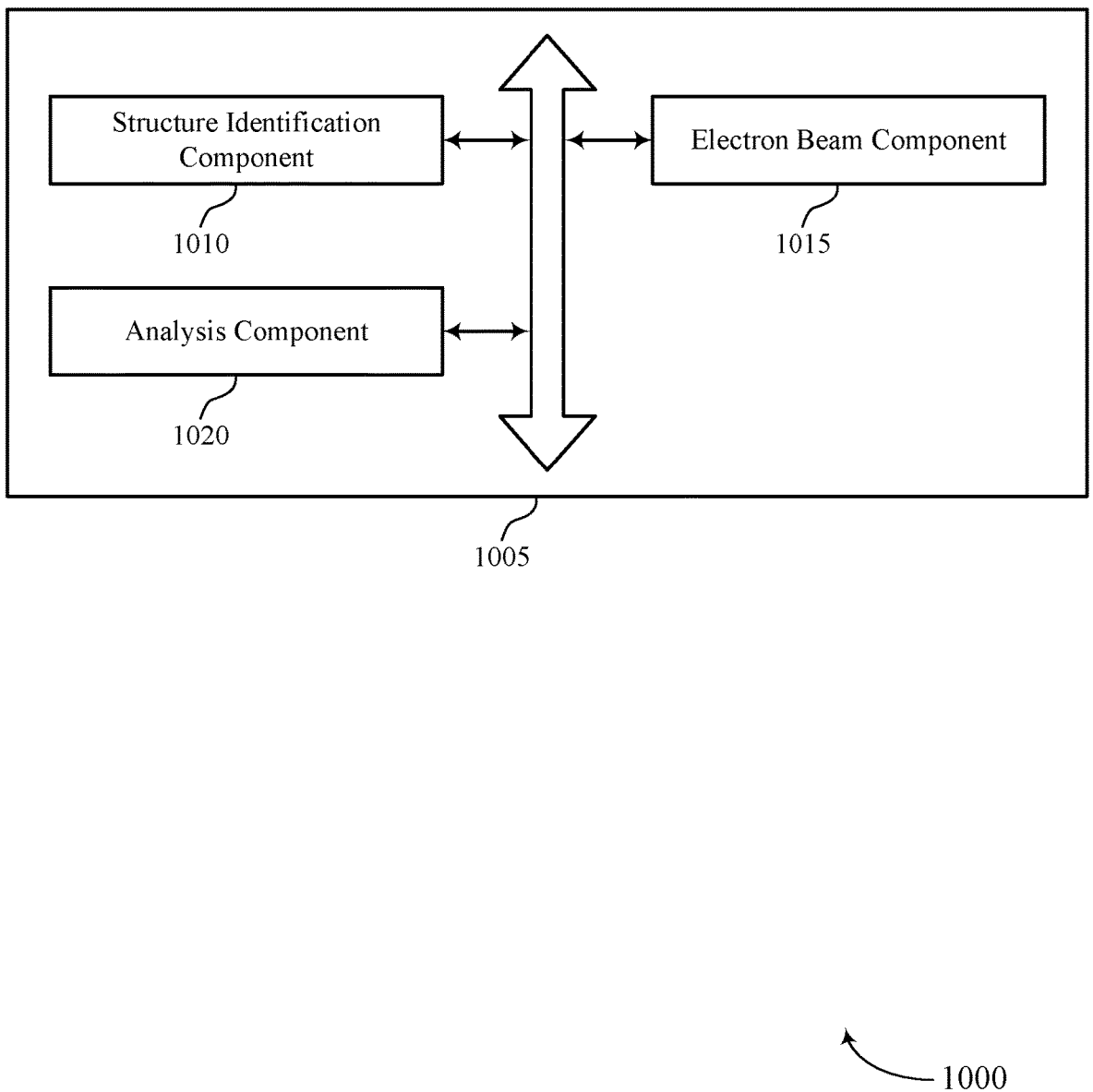
FIG. 10 shows a block diagram of a testing manager that supports electron beam probing techniques and related structures in accordance with aspects of the present disclosure.

FIG. 10 shows a block diagram 1000 of a testing manager 1005 that supports electron beam probing techniques and related structures in accordance with examples as disclosed herein. The testing manager 1005 may include a structure identification component 1010, an electron beam component 1015, and an analysis component 1020. Each of these modules may communicate, directly or indirectly, with one another (e.g., via one or more buses).

The structure identification component 1010 may identify a set of loops, where a first subset of the loops is coupled with a ground reference and a second subset of the loops is isolated from the ground reference. In some cases, the loops in the second subset are each configured to be electrically floating. In some cases, the set of loops includes at least one loop that is concentric about a second loop of the set.

The electron beam component 1015 may scan the set of loops with the electron beam. In some cases, the loops are included in a top surface of a wafer when scanned with the electron beam.

The analysis component 1020 may generate an optical pattern based on scanning the set of loops with the electron beam. In some examples, the analysis component 1020 may compare the generated optical pattern to a second optical pattern (e.g., an expected optical pattern). In some examples, the analysis component 1020 may determine a leakage path based on a difference between the generated optical pattern and the second optical pattern. In some examples, the analysis component 1020 may determine a brightness of each loop when scanned by the electron beam. In some cases, one or more sets of loops may have a first expected brightness, each set of loops having the first expected brightness adjacent to at least one loop having a second expected brightness that is lower than the first expected brightness.

Figure 11:
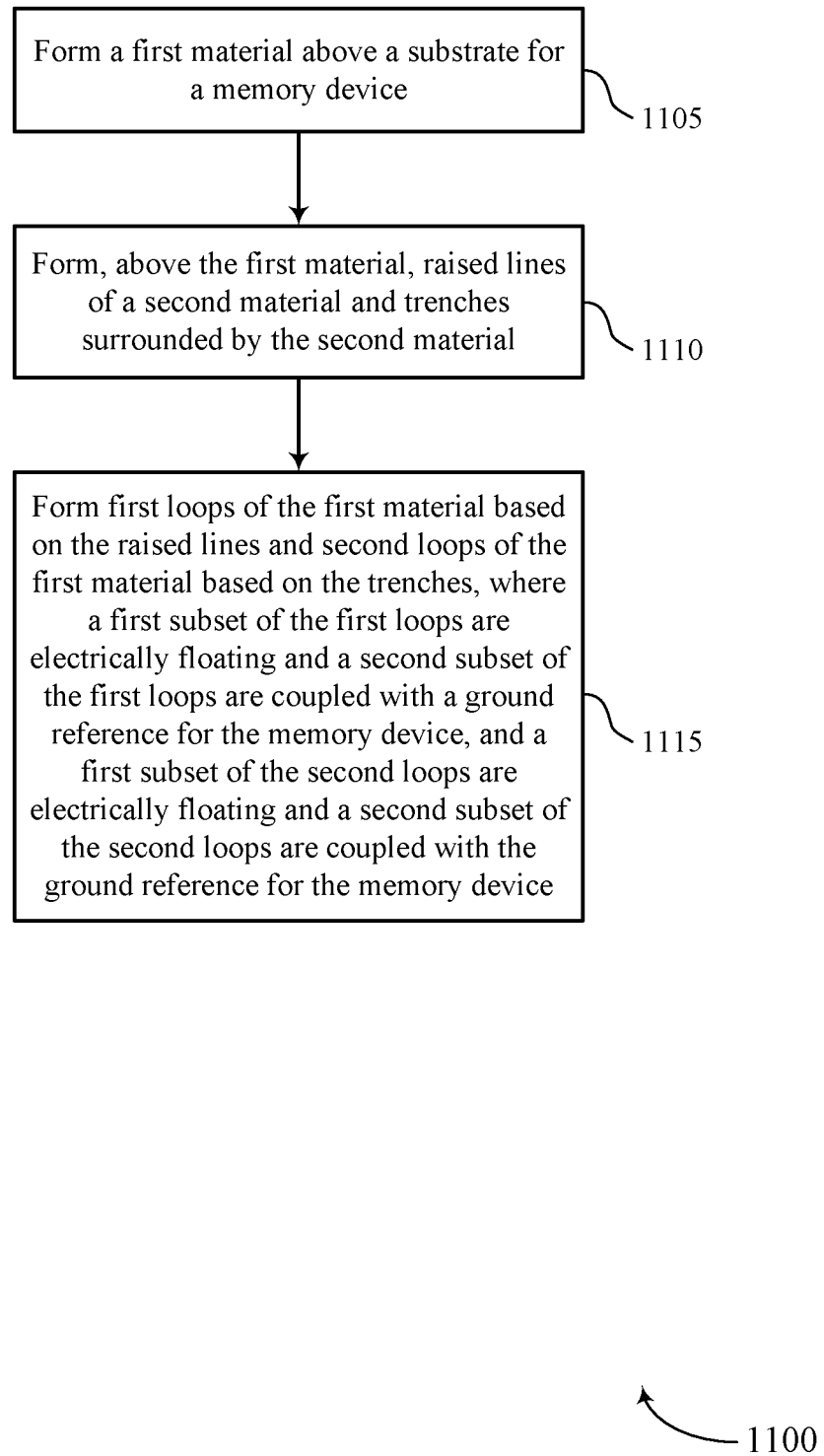
FIGS. 11 and 12 show flowcharts illustrating a method or methods that support electron beam probing techniques and related structures in accordance with examples as disclosed herein.

FIG. 11 shows a flowchart illustrating a method or methods 1100 that supports electron beam probing techniques and related structures in accordance with aspects of the present disclosure. The operations of method 1100 may be implemented by a device or its components as described herein. In some examples, a device may execute a set of instructions to control the functional elements of the device to perform the described functions. Additionally or alternatively, a device may perform aspects of the described functions using special-purpose hardware.

At 1105, the device may form a first material above a substrate for a memory device. The operations of 1105 may be performed according to the methods described herein.

At 1110, the device may form, above the first material, raised lines of a second material and trenches surrounded by the second material. The operations of 1110 may be performed according to the methods described herein.

At 1115, the device may form first loops of the first material based on the raised lines and second loops of the first material based on the trenches, where a first subset of the first loops are electrically floating and a second subset of the first loops are coupled with a ground reference for the memory device, and a first subset of the second loops are electrically floating and a second subset of the second loops are coupled with the ground reference for the memory device. The operations of 1115 may be performed according to the methods described herein.

In some examples, an apparatus as described herein may perform a method or methods, such as the method 1100. The apparatus may include features, means, or instructions (e.g., a non-transitory computer-readable medium storing instructions executable by a processor) for forming a first material above a substrate for a memory device, forming, above the first material, raised lines of a second material and trenches surrounded by the second material, and forming first loops of the first material based on the raised lines and second loops of the first material based on the trenches. A first subset of the first loops may be electrically floating and a second subset of the first loops may be coupled with a ground reference for the memory device. A first subset of the second loops may be electrically floating and a second subset of the second loops may be coupled with the ground reference for the memory device.

Some examples of the method 1100 and the apparatus described herein may further include operations, features, means, or instructions for forming, above the first material, a first set of loops of a third material and a second set of loops of the third material, where each of the first set of loops of the third material surrounds a corresponding raised line of the set and each of the second set of loops of the third material is within a trench of the set.

In some examples of the method 1100 and the apparatus described herein, forming the first loops of the first material and the second loops of the first material may include operations, features, means, or instructions for removing a portion of the first material while using the first set of loops of the third material as a first mask for the first loops of the first material and using the second set of loops of the third material as a second mask for the second loops of the first material. In some examples of the method 1100 and the apparatus described herein, forming the first set of loops of the third material and the second set of loops of the third material may include operations, features, means, or instructions for forming the third material conformally on sidewalls of the set of raised lines and on sidewalls of the set of trenches.

In some examples of the method 1100 and the apparatus described herein, forming the trenches may include operations, features, means, or instructions for forming a second set of raised lines of the second material, the second set of raised lines parallel to the raised lines, and forming a third set of raised lines of the second material, where the third set of raised lines intersect the second set of raised lines, each trench of the set surrounded by two raised lines of the second set and two raised lines of the third set. In some examples of the method 1100 and the apparatus described herein, the second set of raised lines and the third set of raised lines may be formed concurrently based on a same photolithographic mask. In some examples of the method 1100 and the apparatus described herein, the first loops and the second loops may be formed concurrently.

Some examples of the method 1100 and the apparatus described herein may further include operations, features, means, or instructions for forming, below the first material, a set of drivers that includes a corresponding driver for each of the first loops and each of the second loops, and forming, for each of the second subset of the first loops and each of the second subset of the second loops, an interconnect with a corresponding driver, where each of the first subset of the first loops and each of the first subset of the second loops may be not coupled with any driver. Some examples of the method 1100 and the apparatus described herein may further include operations, features, means, or instructions for forming access lines for the memory device, the access lines including the first material.

In some examples of the method 1100 and the apparatus described herein, the first material may be formed as part of a stack of materials for access lines and memory cells of the memory device, and forming a first loops of the first material or a second loop of the second material may include operations, features, means, or instructions for forming a corresponding loop of the stack of materials. In some examples of the method 1100 and the apparatus described herein, the raised lines of the set and the trenches of the set each may have tapered ends.

Some examples of the method 1100 and the apparatus described herein may further include operations, features, means, or instructions for forming a set of first concentric loops of the first material that each surround a corresponding first loop of the first material, and forming a set of second concentric loops of the first material that each surround a corresponding second loop of the first material. In some examples, a first subset of the first concentric loops are electrically floating and a second subset of the first concentric loops are coupled with a ground reference for the memory device, and a first subset of the second concentric loops are electrically floating and a second subset of the second concentric loops are coupled with the ground reference for the memory device.

Figure 12:
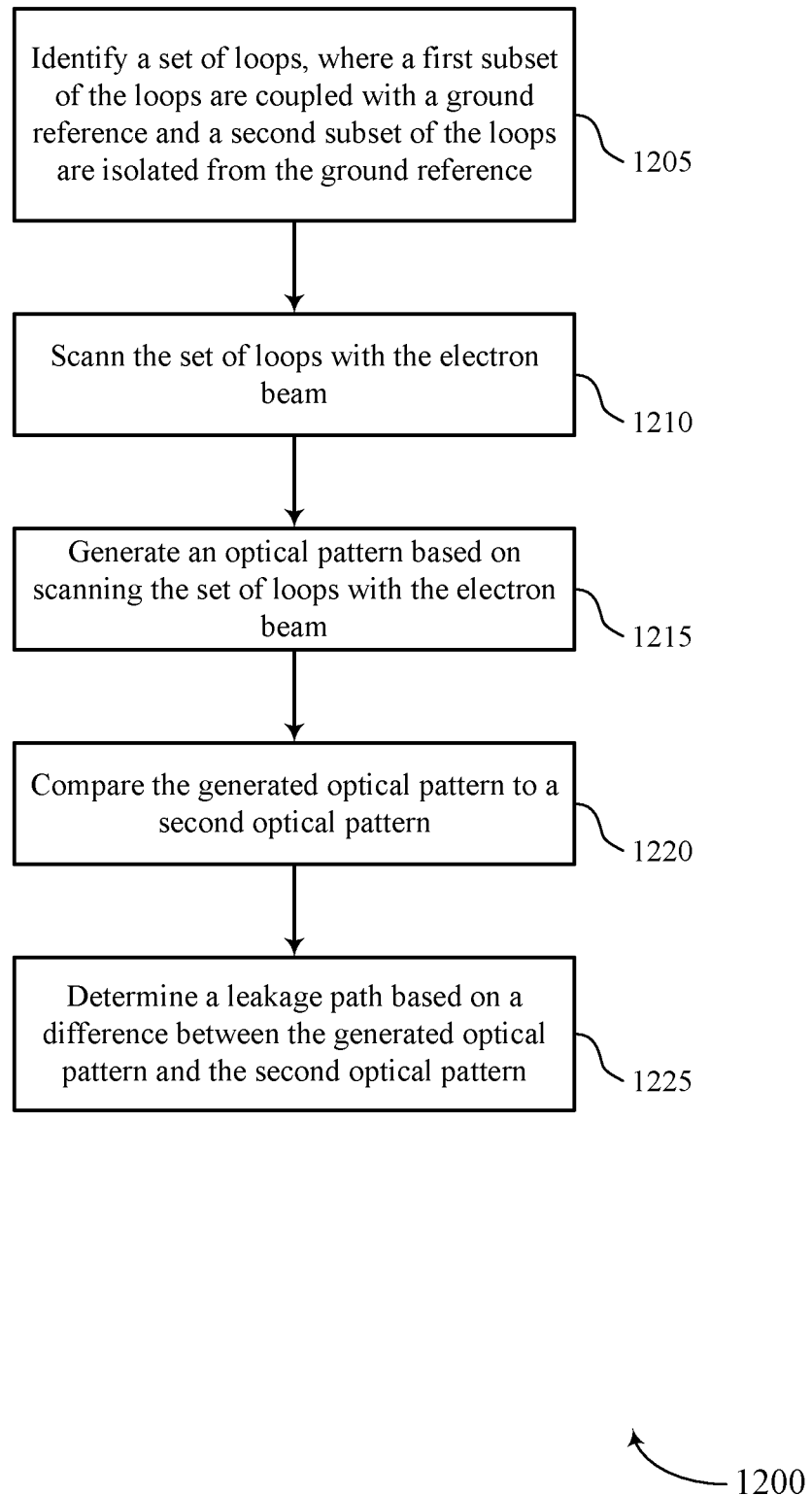

FIG. 12 shows a flowchart illustrating a method or methods 1200 that supports electron beam probing techniques and related structures in accordance with aspects of the present disclosure. The operations of method 1200 may be implemented by a testing manager or its components as described herein. For example, the operations of method 1200 may be performed by a testing manager as described with reference to FIG. 10. In some examples, a testing manager may execute a set of instructions to control the functional elements of the testing manager to perform the described functions. Additionally or alternatively, a testing manager may perform aspects of the described functions using special-purpose hardware.

At 1205, the testing manager may identify a set of loops, where a first subset of the loops is coupled with a ground reference and a second subset of the loops is isolated from the ground reference. The operations of 1205 may be performed according to the methods described herein. In some examples, aspects of the operations of 1205 may be performed by a structure identification component as described with reference to FIG. 10.

At 1210, the testing manager may scan the set of loops with the electron beam. The operations of 1210 may be performed according to the methods described herein. In some examples, aspects of the operations of 1210 may be performed by an electron beam component as described with reference to FIG. 10.

At 1215, the testing manager may generate an optical pattern based on scanning the set of loops with the electron beam. The operations of 1215 may be performed according to the methods described herein. In some examples, aspects of the operations of 1215 may be performed by an analysis component as described with reference to FIG. 10.

At 1220, the testing manager may compare the generated optical pattern to a second optical pattern (e.g., an expected pattern). The operations of 1220 may be performed according to the methods described herein. In some examples, aspects of the operations of 1220 may be performed by an analysis component as described with reference to FIG. 10.

At 1225, the testing manager may determine a leakage path based on a difference between the generated optical pattern and the second optical pattern. The operations of 1225 may be performed according to the methods described herein. In some examples, aspects of the operations of 1225 may be performed by an analysis component as described with reference to FIG. 10.

In some examples, an apparatus as described herein may perform a method or methods, such as the method 1200. The apparatus may include features, means, or instructions (e.g., a non-transitory computer-readable medium storing instructions executable by a processor) for identifying a set of loops, where a first subset of the loops are coupled with a ground reference and a second subset of the loops are isolated from the ground reference, scanning the set of loops with the electron beam, generating an optical pattern based on scanning the set of loops with the electron beam, comparing the generated optical pattern to a second optical pattern, and determining a leakage path based on a difference between the generated optical pattern and the second optical pattern.

In some examples of the method 1200 and the apparatus described herein, generating the optical pattern may include operations, features, means, or instructions for determining a brightness of each loop when scanned by the electron beam. In some examples of the method 1200 and the apparatus described herein, the loops in the second subset may be each configured to be electrically floating. In some examples of the method 1200 and the apparatus described herein, the second optical pattern may include operations, features, means, or instructions for one or more sets of loops having a first expected brightness, each set of loops having the first expected brightness adjacent to at least one loop having a second expected brightness that may be lower than the first expected brightness.

In some examples of the method 1200 and the apparatus described herein, the loops may be included in a top surface of a wafer when scanned with the electron beam. In some examples of the method 1200 and the apparatus described herein, the set of loops includes at least one loop that may be concentric about a second loop of the set.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of access lines for a memory device, the set of access lines at a first level of the memory device and including a first material, a first set of lines including the first material and at the first level of the memory device, the first set of lines each electrically floating, and a second set of lines including the first material and at the first level of the memory device, the second set of lines each coupled with a ground reference, where at least two lines of the first set are interposed between a first line of the second set and a second line of the second set.

Some examples may further include at least three lines of the first set may be interposed between the first line of the second set and the second line of the second set. In some examples, the at least two lines of the first set may be interposed between a first pair of lines of the second set and a second pair of lines of the second set. Some examples may further include at least six lines of the first set may be interposed between a first pair of lines of the second set and a second pair of lines of the second set. Some examples may further include three lines of the first set may be interposed between a third line of the second set and a fourth line of the second set.

In some examples, the first set of lines may be included in a first set of loops, each of the first set of loops including a pair of lines in the first set, and the second set of lines may be included in a first set of loops, each of the first set of loops including a pair of lines in the second set. Some examples of the apparatus may include an interconnect layer below the first level of the memory device and including a set of gaps, each of the first set of lines isolated from the ground reference by a gap in the set of gaps, and a set of driver circuits below the first level of the memory device, each of the second set of lines coupled with the ground reference by a corresponding driver circuit in the set of driver circuits.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a substrate coupled with a test stage, the substrate at a first level of a memory device;
    a set of access lines for the memory device, the set of access lines at a second level of the memory device and comprising a first material;
    a first set of lines comprising the first material and at the second level of the memory device, the first set of lines each electrically floating; and
    a second set of lines comprising the first material and at the second level of the memory device, the second set of lines each coupled with a ground reference.

2. The apparatus of claim 1, wherein at least two lines of the first set are interposed between a first line of the second set and a second line of the second set.

3. The apparatus of claim 2, wherein at least three lines of the first set are interposed between a first line of the second set and a second line of the second set.

4. The apparatus of claim 1, wherein at least two lines of the first set are interposed between a first pair of lines of the second set and a second pair of lines of the second set.

5. The apparatus of claim 1, wherein at least six lines of the first set are interposed between a first pair of lines of the second set and a second pair of lines of the second set.

6. The apparatus of claim 5, wherein three lines of the first set are interposed between a third line of the second set and a fourth line of the second set.

7. The apparatus of claim 1, wherein at least a first subset of the first set of lines is included in a first set of loops, each of the first set of loops comprising a pair of lines in the first set.

8. The apparatus of claim 7, wherein the second set of lines are included in a second set of loops, each of the second set of loops comprising a pair of lines in the second set.

9. The apparatus of claim 8, wherein at least one second loop is interposed between two first loops and at least one first loop is interposed between two second loops.

10. The apparatus of claim 7, wherein the second set of lines and at least a second subset of the first set of lines are included in a third set of loops, each loop of the third set of loops comprising at least one line in the first set and at least one line in the second set.

11. The apparatus of claim 10, wherein at least one third loop is interposed between two first loops and at least one first loop is interposed between two third loops.

12. The apparatus of claim 10, wherein each loop of the first set of loops is surrounded by a respective loop of the third set of loops.

13. The apparatus of claim 10, wherein each loop of the third set of loops is surrounded by a respective loop of the first set of loops.

14. The apparatus of claim 10, wherein:
- each loop of a first subset of the first set of loops is surrounded by a respective loop of a second subset of the first set of loops; and
- each loop of a first subset of the third set of loops is surrounded by a respective loop of a second subset of the third set of loops.

15. The apparatus of claim 1, further comprising:
- an interconnect layer below the first level of the memory device and comprising a plurality of gaps, each of the first set of lines isolated from the ground reference by a gap in the plurality of gaps.

16. The apparatus of claim 1, further comprising:
- a plurality of driver circuits below the first level of the memory device, each of the second set of lines coupled with the ground reference by a corresponding driver circuit in the plurality of driver circuits.

17. The apparatus of claim 1, wherein access lines of the set of access lines are parallel.

18. The apparatus of claim 1, wherein one or more of the first set of lines and one or more of the second set of lines indicate a voltage leakage associated with one or more access lines of the set of access lines.

* * * * *